(12) United States Patent
Suzuki et al.

(10) Patent No.: US 8,783,577 B2
(45) Date of Patent: Jul. 22, 2014

(54) SEMICONDUCTOR DEVICE AND ELECTRONIC DEVICE HAVING THE SAME

(75) Inventors: Yukie Suzuki, Isehara (JP); Yasuyuki Arai, Atsugi (JP); Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 1020 days.

(21) Appl. No.: 11/885,634

(22) PCT Filed: Mar. 9, 2006

(86) PCT No.: PCT/JP2006/305180
§ 371 (c)(1),
(2), (4) Date: Sep. 5, 2007

(87) PCT Pub. No.: WO2006/098390
PCT Pub. Date: Sep. 21, 2006

(65) Prior Publication Data
US 2008/0169349 A1 Jul. 17, 2008

(30) Foreign Application Priority Data
Mar. 15, 2005 (JP) .................... 2005-073171

(51) Int. Cl.
*G06K 19/06* (2006.01)
(52) U.S. Cl.
USPC .......................................................... 235/492
(58) Field of Classification Search
USPC ................ 235/492; 257/359, E27.116; 343/700 MS
See application file for complete search history.

(56) References Cited

U.S. PATENT DOCUMENTS

| 5,510,758 A | 4/1996 | Fujita et al. |
| 5,643,804 A | 7/1997 | Arai et al. |

(Continued)

FOREIGN PATENT DOCUMENTS

| EP | 1 061 577 | 12/2000 |
| EP | 1 126 522 | 8/2001 |

(Continued)

OTHER PUBLICATIONS

International Search Report (Application No. PCT/JP2006/305180) dated May 16, 2006.

(Continued)

*Primary Examiner* — Michael G Lee
*Assistant Examiner* — David Tardif
(74) *Attorney, Agent, or Firm* — Eric J. Robinson; Robinson Intellectual Property Law Office, P.C.

(57) ABSTRACT

It is an object of the present invention to provide a wireless chip of which mechanical strength can be increased. Moreover, it is an object of the present invention to provide a wireless chip which can prevent an electric wave from being blocked. The invention is a wireless chip in which a layer having a thin film transistor is fixed to an antenna by an anisotropic conductive adhesive or a conductive layer, and the thin film transistor is connected to the antenna. The antenna has a dielectric layer, a first conductive layer, and a second conductive layer. The dielectric layer is sandwiched between the first conductive layer and the second conductive layer. The first conductive layer serves as a radiating electrode and the second conductive layer serves as a ground contact body.

91 Claims, 23 Drawing Sheets

(56) References Cited

U.S. PATENT DOCUMENTS

| | | | |
|---|---|---|---|
| 5,877,533 A | 3/1999 | Arai et al. | |
| 6,410,960 B1 | 6/2002 | Arai et al. | |
| 6,559,798 B1 | 5/2003 | Marumoto et al. | |
| 6,853,052 B2 | 2/2005 | Ishikawa | |
| 7,208,355 B2 | 4/2007 | Ishikawa | |
| 7,230,316 B2 | 6/2007 | Yamazaki et al. | |
| 7,485,838 B2 | 2/2009 | Nishi et al. | |
| 7,732,002 B2 | 6/2010 | Kodas et al. | |
| 7,838,812 B2 | 11/2010 | Nishi et al. | |
| 7,928,910 B2 | 4/2011 | Suzuki et al. | |
| 8,026,152 B2 | 9/2011 | Yamazaki et al. | |
| 8,049,157 B2 | 11/2011 | Nishi et al. | |
| 2001/0052645 A1 | 12/2001 | Op'T Eynde et al. | |
| 2004/0164302 A1* | 8/2004 | Arai et al. | 257/72 |
| 2004/0238827 A1* | 12/2004 | Takayama et al. | 257/79 |
| 2005/0127443 A1* | 6/2005 | Ishikawa | 257/347 |
| 2005/0135181 A1* | 6/2005 | Shionoiri et al. | 365/230.06 |
| 2006/0049986 A1* | 3/2006 | Dunn et al. | 343/700 MS |
| 2006/0170046 A1* | 8/2006 | Hara | 257/347 |
| 2006/0202269 A1 | 9/2006 | Suzuki et al. | |
| 2006/0254502 A1* | 11/2006 | Garrou et al. | 117/84 |
| 2007/0085112 A1* | 4/2007 | Yamazaki et al. | 257/288 |
| 2007/0178232 A1 | 8/2007 | Kodas et al. | |
| 2007/0295964 A1 | 12/2007 | Ishikawa | |
| 2008/0277648 A1* | 11/2008 | Wakita | 257/40 |
| 2011/0180811 A1 | 7/2011 | Suzuki et al. | |
| 2012/0007159 A1 | 1/2012 | Yamazaki et al. | |

FOREIGN PATENT DOCUMENTS

| | | |
|---|---|---|
| EP | 1143562 A | 10/2001 |
| JP | 03-127521 | 5/1991 |
| JP | 03-132095 A | 6/1991 |
| JP | 03-084618 | 8/1991 |
| JP | 03-125510 | 12/1991 |
| JP | 07-045787 A | 2/1995 |
| JP | 07-046009 | 2/1995 |
| JP | 08-139522 A | 5/1996 |
| JP | 08-186437 A | 7/1996 |
| JP | 09-001970 A | 1/1997 |
| JP | 09-083239 | 3/1997 |
| JP | 09-147203 | 6/1997 |
| JP | 10-270934 | 10/1998 |
| JP | 10-303640 | 11/1998 |
| JP | 11-261456 | 9/1999 |
| JP | 2000-196334 A | 7/2000 |
| JP | 2000-357771 | 12/2000 |
| JP | 2000349544 | 12/2000 |
| JP | 2001-292026 | 10/2001 |
| JP | 2001-339239 | 12/2001 |
| JP | 2002-031818 A | 1/2002 |
| JP | 2002-084134 | 3/2002 |
| JP | 2002-344140 A | 11/2002 |
| JP | 2002-344146 | 11/2002 |
| JP | 2002-344346 | 11/2002 |
| JP | 2004-088508 | 3/2004 |
| JP | 2004-207596 A | 7/2004 |
| JP | 2004-241750 | 8/2004 |
| JP | 2004-280392 A | 10/2004 |
| JP | 2005-011190 A | 1/2005 |
| JP | 2005-506901 | 3/2005 |
| WO | WO-03/035279 | 5/2003 |

OTHER PUBLICATIONS

Written Opinion (Application No. PCT/JP2006/305180) dated May 16, 2006.

Korean Office Action (Application No. 2007-7023654) Dated Jan. 9, 2012.

Chinese Office Action (Application No. 200680008486.7) Dated Mar. 8, 2011.

* cited by examiner

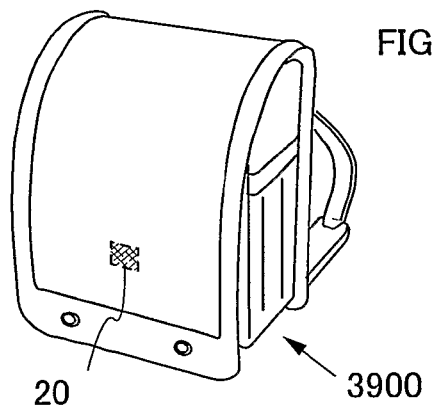
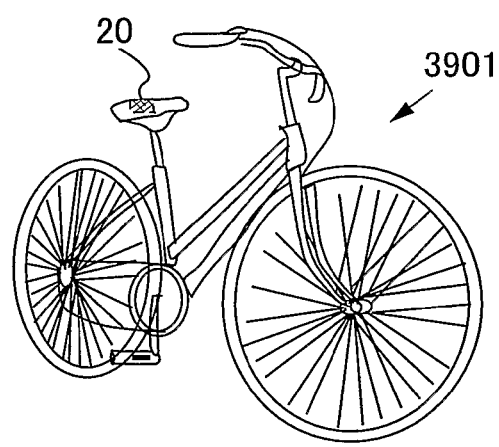
FIG.11A
FIG.11B
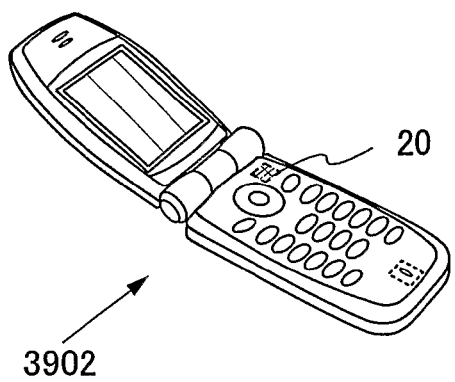
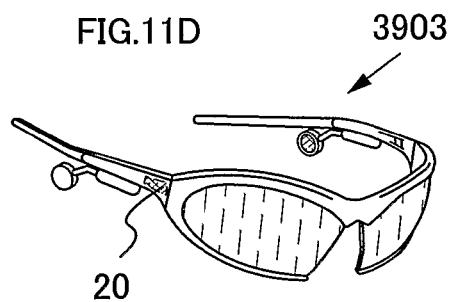
FIG.11C
FIG.11D
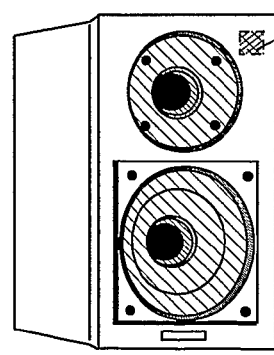
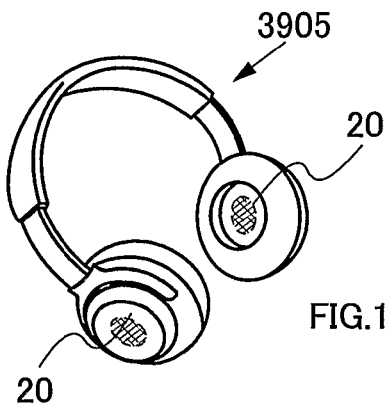
FIG.11E
FIG.11F

SEMICONDUCTOR DEVICE AND ELECTRONIC DEVICE HAVING THE SAME

TECHNICAL FIELD

The present invention relates to a wireless chip by which data can be sent and received through wireless communication and an electronic device having the wireless chip.

BACKGROUND ART

In recent years, of a wireless chip including a plurality of circuits and an antenna has been developed. Such a wireless chip is referred to as an ID tag, an IC tag, an IC chip, an RF (Radio Frequency) tag, a wireless tag, an electronic tag, an RFID (Radio Frequency IDentification) tag, or the like and has already been introduced into some markets.

Many of these wireless chips which are currently in practical use have circuits using semiconductor substrates of silicon or the like (such circuits are also referred to as IC (Integrated Circuit) chips) and antennas. The antenna is formed by a printing method, a method in which a conductive thin film is etched, a plating method, or the like (for example, Patent Document 1: Japanese Patent Application Laid-Open No. H9-1970).

The antenna formed by the above method is a thin film or a thick film. The antenna attached to a flexible material such as paper or plastic has a problem in that the antenna is sensitive to bending or folding, so that a part of the antenna is easily broken.

Moreover, in the case of a wireless chip formed using a semiconductor substrate, the semiconductor substrate serves as a conductor and blocks for an electric wave; therefore, there is a problem that a signal is easily attenuated depending on the direction of a signal which is sent.

DISCLOSURE OF INVENTION

In view of the above problems, it is an object of the present invention to provide a wireless chip of which mechanical strength can be increased. Moreover, it is an object of the present invention to provide a wireless chip which can prevent an electric wave from being blocked. Further, it is another object of the present invention to provide an article having the wireless chip.

A feature of the present invention is a semiconductor device such as a wireless chip and the like in which a layer having a thin film transistor is fixed to an antenna by an anisotropic conductive adhesive or a conductive layer, and the thin film transistor is connected to the antenna. Moreover, the layers having the thin film transistor, a passive element, and the antenna are fixed to each other by an anisotropic conductive adhesive or a conductive layer, and the thin film transistor or the passive element is connected to the antenna.

The layer having a thin film transistor may be formed by stacking a plurality of layers having thin film transistors. Alternatively, a plurality of layers having thin film transistors may be bonded to each other by an anisotropic conductive adhesive. Further, the passive element may be constituted of a plurality of passive elements such as an inductor, a capacitor, and a resistor.

The antenna has a dielectric layer, a first conductive layer, and a second conductive layer. The dielectric layer is sandwiched between the first conductive layer and the second conductive layer. The first conductive layer serves as a radiating electrode and the second conductive layer serves as a ground contact body. Moreover, the antenna has a power feeding layer or a power feeding point.

Further, the present invention includes the following structures.

A mode of the present invention is a wireless chip including: a layer having a thin film transistor; a connection terminal which is formed over a surface of the layer having a thin film transistor and connected to the thin film transistor; an antenna having a first conductive layer serving as a radiating electrode, a second conductive layer serving as a ground contact body, and a dielectric layer sandwiched between the first conductive layer and the second conductive layer; an organic resin layer containing conductive particles connecting the antenna and the connection terminal.

Another mode of the present invention is a wireless chip including: a layer having a thin film transistor; a first connection terminal which is formed over a surface of the layer having a thin film transistor and connected to the thin film transistor; a layer including a passive element having at least one of an inductor, a capacitor, or a resistor; a second connection terminal formed over a first surface of the layer including the passive element; a third connection terminal formed over a second surface opposite to the first surface; a first organic resin layer containing conductive particles connecting the first connection terminal and the second connection terminal; an antenna having a first conductive layer serving as a radiating electrode, a second conductive layer serving as a ground contact body, and a dielectric layer sandwiched between the first conductive layer and the second conductive layer; a second organic resin layer containing conductive particles connecting the third connection terminal and the antenna.

Another mode of the present invention is a wireless chip, including: a layer having a thin film transistor; a first connection terminal which is formed over a surface of the layer having a thin film transistor and connected to the thin film transistor; a layer including a passive element having at least one of an inductor, a capacitor, or a resistor; a second connection terminal formed over a first surface of the layer including the passive element; a third connection terminal formed over a second surface opposite to the first surface; an organic resin layer containing conductive particles connecting the first connection terminal and the second connection terminal; an antenna having a first conductive layer serving as a radiating electrode, a second conductive layer serving as a ground contact body, and a dielectric layer sandwiched between the first conductive layer and the second conductive layer; a third conductive layer connecting the third connection terminal and the antenna.

The layer having a thin film transistor, the first layer, or the second layer has a thickness of 1 μm or more and 10 μm or less, preferably, 1 μm or more and 5 μm or less. The layer having a thin film transistor may be a stack of a plurality of layers having thin film transistors. Further, the layer having a thin film transistor is formed over a flexible insulating substrate, and the thin film transistor may have an organic semiconductor layer. Still further, the layer having a thin film transistor may be fixed to the flexible insulating substrate through an organic resin.

Another mode of the present invention is a wireless chip including: a first layer having a first thin film transistor; a first connection terminal which is formed over a surface of the first layer and connected to the first thin film transistor; a second layer including a second thin film transistor; a second connection terminal formed over a first surface of the second layer; a third connection terminal formed over a second surface opposite to the first surface; a first organic resin layer containing conductive particles connecting the first connection terminal and the second connection terminal; an antenna having a first conductive layer serving as a radiating electrode, a second conductive layer serving as a ground contact body, and a dielectric layer sandwiched between the first conductive layer and the second conductive layer; a second organic resin layer containing conductive particles connecting the third connection terminal and the antenna. The second connection terminal or the third connection terminal are connected to the second thin film transistor.

Another mode of the present invention is a wireless chip including: a first layer having a first thin film transistor; a first connection terminal which is formed over a surface of the first layer and connected to the first thin film transistor; a second layer including a second thin film transistor; a second connection terminal formed over a first surface of the second layer; a third connection terminal formed over a second surface opposite to the first surface; a first organic resin layer containing conductive particles connecting the first connection terminal and the second connection terminal; a layer including a passive element having at least one of an inductor, a capacitor, or a resistor; a fourth connection terminal formed over a first surface of the layer including the passive element; a fifth connection terminal formed over a second surface opposite to the first surface; a second organic resin layer containing conductive particles connecting the third connection terminal and the fourth connection terminal; an antenna having a first conductive layer serving as a radiating electrode, a second conductive layer serving as a ground contact body, and a dielectric layer sandwiched between the first conductive layer and the second conductive layer; a third organic resin layer containing conductive particles connecting the fifth connection terminal and the antenna. The second connection terminal or the third connection terminal are connected to the second thin film transistor.

Another mode of the present invention is a wireless chip including: a first layer having a first thin film transistor; a first connection terminal which is formed over a surface of the first layer and connected to the first thin film transistor; a second layer including a second thin film transistor; a second connection terminal formed over a first surface of the second layer including the second thin film transistor; a third connection terminal formed over a second surface opposite to the first surface; a first organic resin containing conductive particles connecting the first connection terminal and the second connection terminal; a layer including a passive element having at least one of an inductor, a capacitor, or a resistor; a fourth connection terminal formed over a first surface of the layer including the passive element; a fifth connection terminal formed over a second surface opposite to the first surface; a second organic resin containing conductive particles connecting the third connection terminal and the fourth connection terminal; an antenna having a first conductive layer, a second conductive layer serving as a ground contact body, and a dielectric layer sandwiched between the first conductive layer and the second conductive layer; a third conductive layer connecting the fifth connection terminal and the antenna. The second connection terminal or the third connection terminal are connected to the second thin film transistor.

The first layer or the second layer has a thickness of 1 μm or more and 10 μm or less, preferably, 1 μm or more and 5 μm or less. The first layer may be a stack of a plurality of layers having thin film transistors. Further, the first layer is formed over a flexible insulating substrate, and the thin film transistor may have an organic semiconductor layer. Still further, the first layer may be fixed to the flexible insulating substrate through an organic resin.

Another mode of the present invention is a wireless chip including: a layer including a first thin film transistor, a second thin film transistor, and a first antenna connected to the first thin film transistor; a connection terminal which is formed over a surface of the layer including the first thin film transistor, the second thin film transistor, and the first antenna connected to the first thin film transistor, and also connected to the second thin film transistor; a second antenna including a first conductive layer serving as a radiating electrode, a second conductive layer serving as a contact body, and an dielectric layer sandwiched between the first conductive layer and the second conductive layer; and an organic resin layer containing conductive particles connecting the connection terminal and the second antenna.

The layer including the first thin film transistor, the second thin film transistor, and the first antenna connected to the first thin film transistor is formed over a flexible insulating substrate, and the first thin film transistor and the second thin film transistor each include an organic semiconductor layer. Further, the layer including the first thin film transistor, the second thin film transistor, and the first antenna connected to the first thin film transistor may be fixed to a flexible insulating substrate through an organic resin.

Another mode of the present invention is a wireless chip including: a layer including a first thin film transistor and a second thin film transistor; a first connection terminal which is formed over a first surface of a layer including the first thin film transistor and the second thin film transistor and is connected to the first thin film transistor; a second connection terminal which is formed over a second surface opposite to the first surface and is connected to the second thin film transistor; a first antenna including a first conductive layer serving as a radiating electrode, a second conductive layer serving as a ground contact body, and a first dielectric layer sandwiched between the first conductive layer and the second conductive layer; a second antenna including a third conductive layer serving as a radiating electrode, a fourth conductive layer serving as a ground contact body, and a second dielectric layer sandwiched between the third conductive layer and the fourth conductive layer; a first organic resin containing conductive particles connecting the first antenna and the first connection terminal; and a second organic resin containing conductive particles connecting the second antenna and the second connection terminal.

Note that the film thickness of the layer having the first layer and the second layer is 1 μm or more and 10 μm or less, preferably, 1 μm or more and 5 μm or less.

The wireless chip has a central processing unit and a detection portion other than a high frequency circuit.

At least one of the layer having a thin film transistor, the first layer having the first thin film transistor, the second layer having the second thin film transistor, the first thin film transistor, the second thin film transistor, the layer having the first antenna connected to the first thin film transistor, the layer having the first thin film transistor and the second thin film transistor partially constitutes a power source circuit, a clock generating circuit, a data modulation/demodulation circuit.

The dielectric layer is formed of ceramics, an organic resin, or a mixture of ceramics and an organic resin. As typical examples of ceramics, alumina, glass, forsterite, barium titanate, lead titanate, strontium titanate, lead zirconate, lithium niobate, and lead zirconium titanate are given. As typical examples of the dielectric layer, an epoxy resin, a phenol resin, a polybutadiene resin, a bismaleimide triazine resin, vinylbenzyl, and polyfumarate are given.

The present invention provides an electronic device having the above wireless chip. As typical examples of the electronic device, a liquid crystal display device, an EL display device, a television device, a cellular phone, a printer, a camera, a personal computer, a speaker device, a headphone, a navigation device, a car-mounted ETC device, an electronic key, and the like are given.

The layer having the thin film transistor can be formed so as to have almost the same area as the antenna. The antenna serves as a protector for the layer having the thin film transistor. Therefore, the mechanical strength of the wireless chip is improved.

Since a patch antenna has high mechanical strength, the patch antenna can be reused. Therefore, a wireless chip can be provided on a recyclable container such as a returnable container.

Further, since a wireless chip of the present invention is formed using an electrically-isolated thin film integrated circuit, an electric wave is more difficult to be blocked than in a wireless chip having an integrated circuit formed using a semiconductor substrate, thereby suppressing the attenuation of a signal due to the block of an electric wave. Thus, it is possible to send and receive data with high efficiency.

As to a wireless chip including an integrated circuit which is formed using a thin film transistor and a passive element formed with a thick film pattern, each circuit can be formed using an element having a suitable function. By mounting a wireless chip of the present invention to a wiring substrate, the number of mount parts can be decreased; thus, the area of a wiring substrate can be reduced and the electronic device having the wiring substrate can be miniaturized accordingly.

BRIEF DESCRIPTION OF DRAWINGS

In the accompanying drawings:

FIGS. 11A to 11F each show an application example of a wireless chip of the present invention;

BEST MODE FOR CARRYING OUT THE INVENTION

Figure 1A:
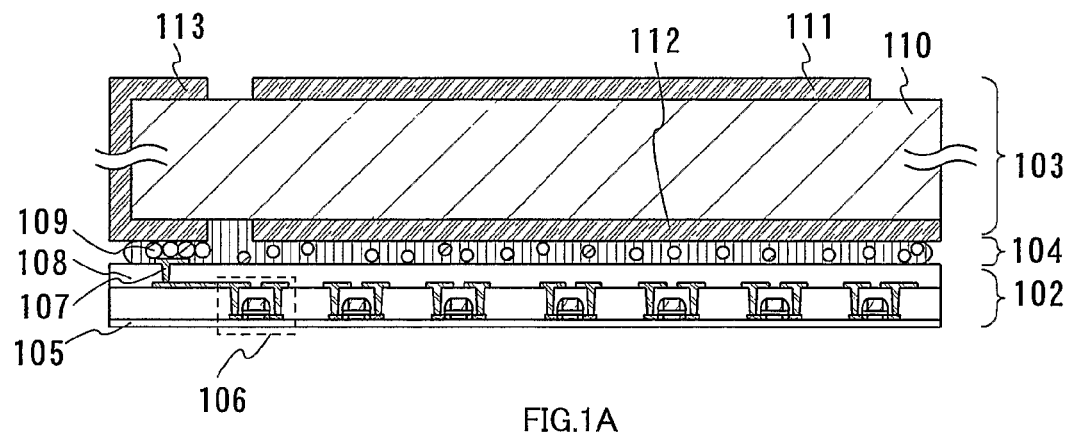
FIGS. 1A and 1B are cross-sectional views each showing a wireless chip of the present invention.

Embodiment Modes and Embodiments of the present invention will be described with reference to the drawings. Note that the present invention can be implemented in many different modes, and it is easily understood by those skilled in the art that the modes and details can be variously modified without departing from the spirit and scope of the present invention. Therefore, the present invention is not construed as being limited to the description of Embodiment Modes and Embodiments. In all the drawings for describing Embodiment Modes and Embodiments, the same reference numerals denote the parts having similar functions or the same functions, and the descriptions will not be repeated.

Embodiment Mode 1

Figure 1B:
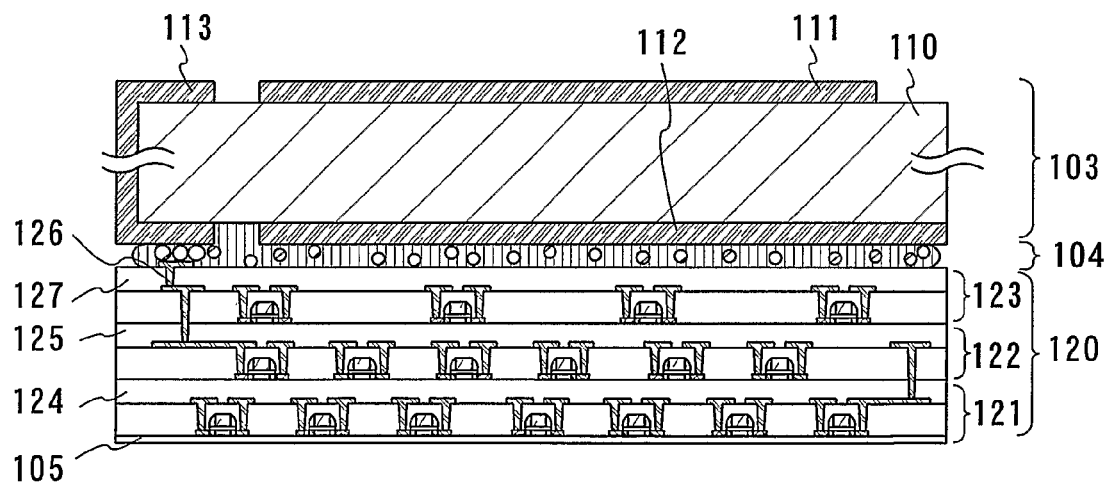

An embodiment mode of a wireless chip of the present invention is shown in FIGS. 1A and 1B. FIGS. 1A and 1B are cross-sectional views each showing a wireless chip.

In a wireless chip of this embodiment mode, a layer 102 having a thin film transistor is fixed to an antenna 103 with an anisotropic conductive adhesive 104. Moreover, a connection terminal 107 of the layer 102 having a thin film transistor and a power feeding layer 113 of the antenna are electrically connected by conductive particles 109 dispersed in the anisotropic conductive adhesive 104. Further, although not shown, a ground wiring of the layer having a thin film transistor is electrically connected to a conductive layer serving as a ground contact body of the antenna by the conductive particles 109 dispersed in the anisotropic conductive adhesive 104.

The layer 102 having a thin film transistor includes a thin film transistor 106 formed over the insulating layer 105, an interlayer insulating layer 108 formed over the thin film transistor 106, and a connection terminal 107 which is exposed at a surface of the interlayer insulating layer 108 and which is connected to the thin film transistor 106. The layer 102 having a thin film transistor may have a resistance element, a capacitor, and the like, in addition to the thin film transistor 106.

The layer having a thin film transistor formed is preferably as large as the antenna 103, which is several mm×several mm to several tens mm×several tens mm. Moreover, the thickness of the layer having a thin film transistor ranges from several μm to several tens μm, typically from 1 μm to 10 μm and preferably from 2 μm to 5 μm.

The insulating layer 105 serves as a protective layer of the layer 102 having a thin film transistor. The insulating layer 105 is formed of silicon oxide, silicon oxynitride, silicon nitride oxide, silicon nitride, or the like by a known method such as a sputtering method or a plasma CVD method.

Figure 16A:
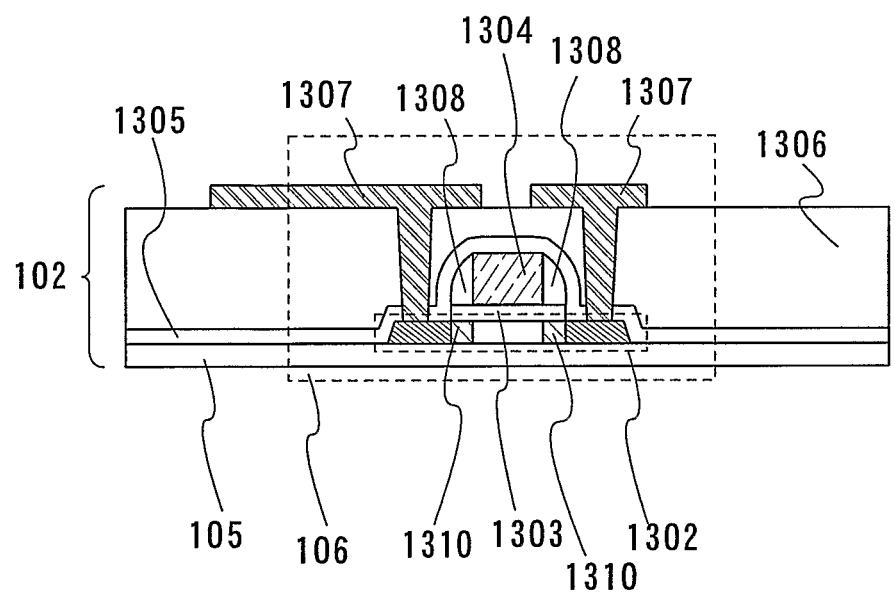
FIGS. 16A and 16B are cross-sectional views each showing a thin film transistor applicable to the present invention.
Figure 16B:
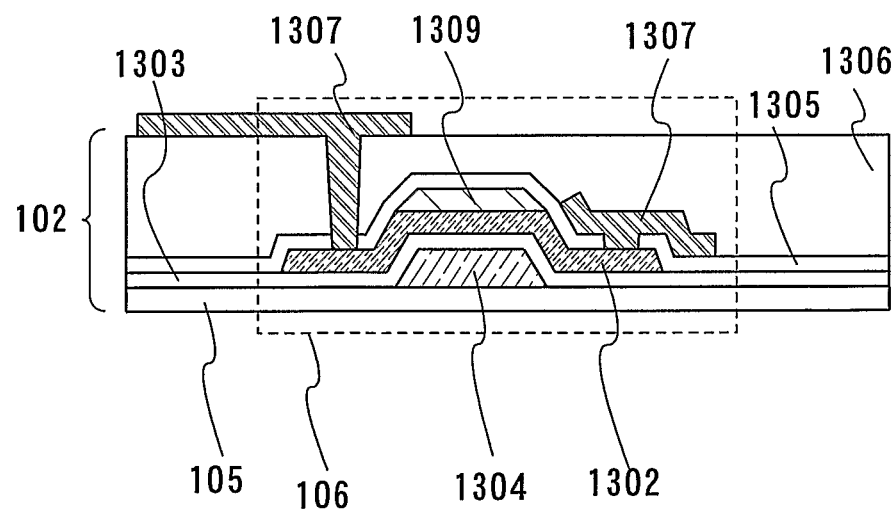

A mode of the thin film transistor 106 will be described with reference to FIGS. 16A and 16B. FIG. 16A shows an example of a top gate thin film transistor. The thin film transistor 106 is provided over the insulating layer 105. In the thin film transistor 106, a semiconductor layer 1302 and an insulating layer 1303 serving as a gate insulating layer are provided over the insulating layer 105. Over the insulating layer 1303, a gate electrode 1304 corresponding to the semiconductor layer 1302 is formed. An insulating layer 1305 serving as a protective layer and an insulating layer 1306 serving as an interlayer insulating layer are formed over the gate electrode 1304. An insulating layer serving as a protective layer may be further formed over the insulating layer 1306.

The semiconductor layer 1302 is a layer formed using a semiconductor having a crystalline structure. A non-single crystal semiconductor or a single crystal semiconductor can be used. In particular, it is preferable to use a crystalline semiconductor obtained by crystallizing an amorphous or microcrystalline semiconductor by laser irradiation, a crystalline semiconductor obtained by crystallizing an amorphous or microcrystalline semiconductor by heat treatment, or a crystalline semiconductor obtained by crystallizing an amorphous or microcrystalline semiconductor by combination of heat treatment and laser irradiation. In the heat treatment, a crystallization method using a metal element such as nickel which can promote crystallization of a silicon semiconductor can be used.

In the case of crystallization by laser irradiation, it is possible to conduct crystallization in such a way that a melting zone in which a crystalline semiconductor that is melted is irradiated with laser light and continuously moved in a direction where the laser light is delivered, wherein the laser light is continuous wave laser light or ultrashort pulsed laser light having a high repetition rate of 10 MHz or more and a pulse width of 1 nanosecond or less, preferably 1 to 100 picoseconds. By using such a crystallization method, a crystalline semiconductor having large grain diameter with a crystal grain boundary extending in one direction can be obtained. By making a drift direction of carriers conform to the direction where the crystal grain boundary extends, the electric field effect mobility in the transistor can be increased. For example, 400 cm$^2$/V·sec or more can be achieved.

In the case of applying the above crystallization process to a crystallization process where the temperature is not more than the heat resistant temperature of a glass substrate (approximately 600° C.), a large glass substrate can be used. Therefore, a large number of wireless chips can be manufactured using one substrate, and the cost can be decreased.

The semiconductor layer 1302 may be formed by conducting a crystallization process by heating at a temperature higher than the heat resistant temperature of a glass substrate. Typically, a quartz substrate is used as the insulating substrate and an amorphous or microcrystalline semiconductor is heated at 700° C. or more to form the semiconductor layer 1302. As a result, a semiconductor with high crystallinity can be formed. Therefore, a thin film transistor which is superior in response speed, mobility, and the like and which is capable of high-speed operation can be provided.

Moreover, a single-crystal semiconductor may be used to form the semiconductor layer 1302.

Since such a transistor in which the semiconductor layer is formed from a single crystal semiconductor has high response speed, mobility, and the like, a transistor capable of high-speed operation can be provided. Moreover, since the transistor has low variation in its characteristics, a wireless chip in which high reliability has been achieved can be provided.

A gate electrode 1304 can be formed with a metal or a poly-crystalline semiconductor doped with an impurity having one conductivity type. In the case of using a metal, tungsten (W), molybdenum (Mo), titanium (Ti), tantalum (Ta), aluminum (Al), or the like can be used. Moreover, metal nitride obtained by nitriding the above metal can also be used. Alternatively, a structure in which a first layer including the metal nitride and a second layer including the metal are stacked may be used. In the case of a layered structure, an end of the first layer may protrude from an end of the second layer. By forming the first layer using metal nitride, the first layer can be used as a metal barrier. In other words, the first layer can prevent the metal of the second layer from diffusing into the insulating layer 1303 and the semiconductor layer 1302 under the insulating layer 1303.

A sidewall (side wall spacer) 1308 is formed on a side surface of the gate electrode 1304. The sidewall can be formed by forming an insulating layer containing silicon oxide over a substrate by CVD and anisotropically etching the insulating layer by an RIE (Reactive Ion Etching) method.

The transistor formed by combining the semiconductor layer 1302, the insulating layer 1303, the gate electrode 1304, and the like can have any structure such as a single drain structure, an LDD (Lightly Doped Drain) structure, or a gate-overlapped drain structure. Here, a thin film transistor having an LDD structure is shown in which a low-concentration impurity region 1310 is formed in a part of the semiconductor layer that overlaps the sidewall is shown. Moreover, a single gate structure, a multi-gate structure in which transistors to which gate voltage having the same electric potential equally is applied are serially connected, or a dual gate structure in which the semiconductor layer is sandwiched between the upper and lower gate electrodes.

The insulating layer 1306 is formed of an inorganic insulating material such as silicon oxide or silicon oxynitride, or an organic insulating material such as an acrylic resin or a polyimide resin. In the case of forming the insulating layer by a coating method such as spin coating or using a roll coater, after applying an insulating film material dissolved in an organic solvent, heat treatment is performed to form silicon oxide for forming the insulating layer. For example, after forming a film including a siloxane bond by a coating method, a heat treatment is conducted at 200 to 400° C., thereby forming the insulating layer with silicon oxide. By using an insulating layer formed by a coating method or an insulating layer which has been flattened by reflow as the insulating layer 1306, it is possible to prevent wirings to be formed over the layer from being broken. Moreover, the insulating layer can also be used effectively in forming a multilayer wiring.

A wiring 1307 formed over the insulating layer 1306 can be provided so as to intersect with a wiring to be formed in the same layer as the gate electrode 1304 and has a multilayer wiring structure. The multilayer wiring structure can be obtained by forming wirings over a plurality of stacked insulating layers which have the similar function to the insulating layer 1306. The wiring 1307 preferably has a combination of a low-resistant material such as aluminum and metal barrier using a refractory metal material such as titanium (Ti) or molybdenum (Mo). For example, a multilayer structure including titanium (Ti) and aluminum (Al), a layered structure including molybdenum (Mo) and aluminum (Al), and the like are given.

Figure 18A:
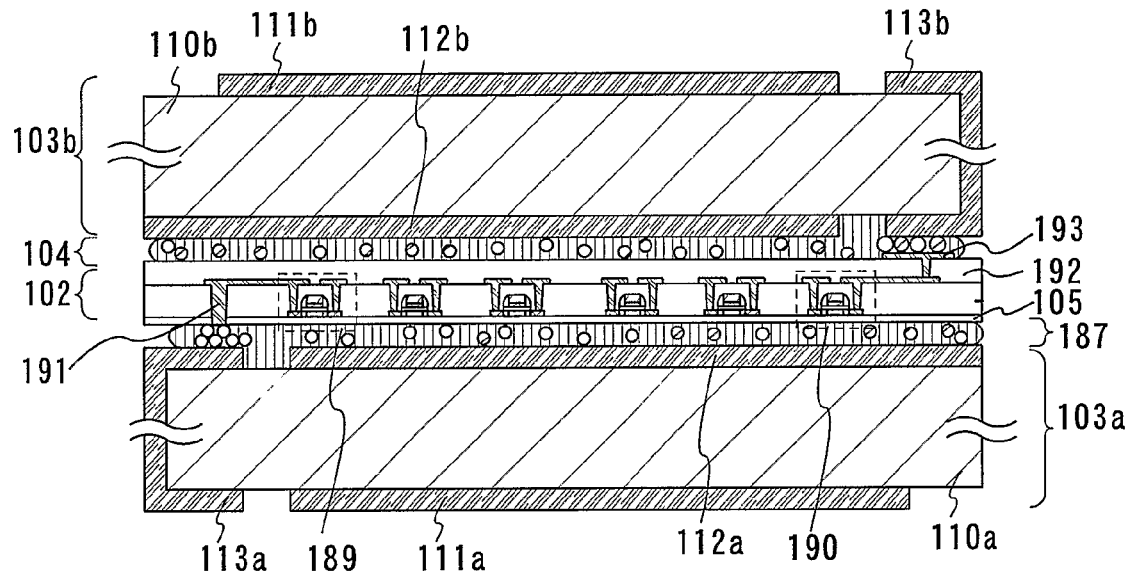
FIGS. 18A and 18B are cross-sectional views each showing a wireless chip according to the present invention.
Figure 18B:
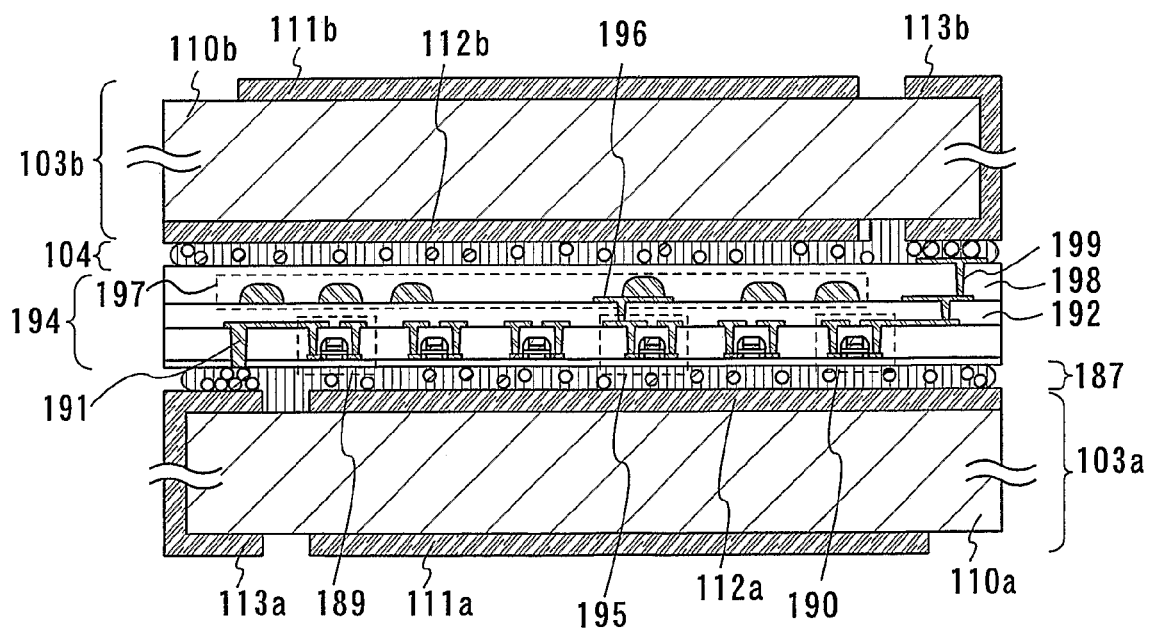

FIG. 18B shows an example of a bottom-gate thin film transistor. The insulating layer 105 is formed over the insulating substrate, and the thin film transistor 106 is provided over the insulating layer 105. In the thin film transistor 106, the gate electrode 1304, the insulating layer 1303 serving as a gate insulating layer, the semiconductor layer 1302, a channel protective layer 1309, the insulating layer 1305 serving as a protective layer, and the insulating layer 1306 serving as an interlayer insulating layer are provided. Moreover, an insulating layer serving as a protective layer may be formed thereover. The wiring 1307 can be formed over the insulating layer 1305 or the insulating layer 1306. In the case of forming the bottom-gate thin film transistor, the insulating layer 105 is not necessarily formed.

The insulating layer 108 shown in FIG. 1A is formed by a similar method to the insulating layer 1306. The connection terminal 107 is formed by a similar method to the wiring 1307. On the uppermost surface of the wiring, a layer may be formed with one or plural elements selected from gold, silver, copper, palladium, and/or platinum by printing, plating, sputtering, or the like.

The anisotropic conductive adhesive 104 is an adhesive organic resin in which conductive particles (each having a grain diameter of approximately several nm to several μm) are dispersed. An epoxy resin, a phenol resin, or the like can be used as the organic resin. The conductive particle is formed of one or a plurality of elements selected from gold, silver, copper, palladium, and/or platinum, or may be a particle having a multilayer structure of these elements. Further, a conductive particle formed with a resin whose surface is coated with a thin film which is formed of one or a plurality of metals selected from gold, silver, copper, palladium, and/or platinum may be used.

As to the layer 102 having a thin film transistor, a release layer is provided over a substrate, a layer 102 having a thin film transistor is formed over the release layer; and the layer 102 having a thin film transistor is thereafter separated from the release layer and attached onto the antenna 103 with an anisotropic conductive adhesive 104. Note that, it is possible to suitably use the following methods as the separating method: (1) a method in which a metal oxide layer is provided between a highly heat resistant substrate and a layer having a thin film transistor, and the metal oxide layer is weaken by crystallization; thus, the layer having a thin film transistor is separated; (2) a method in which an amorphous silicon film containing silicon is provided between a highly heat resistant substrate and a layer having a thin film transistor, and the amorphous silicon film is removed by laser irradiation or etching; thus, the layer having a thin film transistor is separated; (3) a method in which a highly heat resistant substrate (a glass substrate, a silicon substrate, or the like) provided with a thin film transistor is eliminated mechanically or removed by etching using a solution or a halogen fluoride gas such as $NF_3$, $BrF_3$, $ClF_3$; (4) a method in which a release layer and a metal oxide layer are provided between a highly heat resistant substrate and a layer having a thin film transistor, the metal oxide layer is weakened by crystallization, a part of the release layer is removed by etching using a solution or a halogen fluoride gas such as $NF_3$, $BrF_3$, $ClF$, and thereafter separation is carried out at the weakened metal oxide layer; and (5) a method in which a highly heat resistant substrate is used as the substrate, a release layer and a metal oxide layer are provided between the substrate and an insulating layer, a layer 131 having a second thin film transistor is formed over the insulating layer while the metal oxide layer is weakened, a part of the insulating layer of the layer 131 having a second thin film transistor is irradiated with laser light to form an opening (in which a part of the release layer is exposed), the substrate film is thereafter attached to the layer 131 having a second thin film transistor, and then the layer 131 having a second thin film transistor is physically separated from the substrate using the weakened metal oxide layer.

The anisotropic conductive adhesive 104 is an adhesive organic resin in which conductive particles (each having a grain diameter of approximately several nm to several μm) are dispersed. An epoxy resin, a phenol resin, or the like can be used as the organic resin. The conductive particle is formed of one or a plurality of elements selected from gold, silver, copper, palladium, and/or platinum, or may be a particle having a multilayer structure of these elements. Further, a conductive particle formed with a resin whose surface is coated with a thin film which is formed of one or a plurality of metals selected from gold, silver, copper, palladium, and/or platinum may be used.

The antenna 103 has a dielectric layer 110, a first conductive layer 111 formed on one surface of the dielectric layer, a second conductive layer 112 which is formed on another surface of the dielectric layer and which opposes to the first conductive layer 111 with the dielectric layer 110 therebetween, and a power feeding layer 113. An antenna having such a structure is hereinafter referred to as a patch antenna. The first conductive layer 111 serves as a radiating electrode. The second conductive layer 112 serves as a ground contact body. The power feeding layer 113 is provided so as not to contact the first conductive layer 111 and the second conductive layer 112. Power is fed from the antenna to a circuit including the thin film transistor or from the circuit including the thin film transistor to the antenna, through the power feeding layer 113. Incidentally, a power feeding point may be used instead of the power feeding layer to feed power.

In this embodiment mode, the connection terminal 107 is electrically connected to the power feeding layer 113 through the conductive particles 109 included in the anisotropic conductive adhesive 104. Although not shown, a ground electrode of the circuit including the thin film transistor is electrically connected to the second conductive layer 112 of the antenna 103 through the conductive particle 109 in the same manner.

Here, the structure of the patch antenna used as the antenna 103 will be described.

The dielectric layer 110 of the patch antenna can be formed of ceramic, an organic resin, a mixture of ceramic and an organic resin, or the like. As a typical example of ceramic, alumina, glass, forsterite, or the like is given. Moreover, a plurality of ceramics may be mixed. In order to obtain high dielectric constant, it is preferable to form the dielectric layer 110 using a ferroelectric material. As a typical example of the ferroelectric material, barium titanate ($BaTiO_3$), lead titanate ($PbTiO_3$), strontium titanate ($SrTiO_3$), lead zirconate ($PbZrO_3$), lithium niobate ($LiNbO_3$), lead zirconate titanate (PZT), or the like is given. Moreover, a mixture of a plurality of ferroelectric materials may be used.

As the organic resin, a thermosetting resin or a thermoplastic resin is appropriately used. As a typical example of the organic resin, a resin material such as an epoxy resin, a phenol resin, a polybutadiene resin, a bismaleimide triazine resin, vinylbenzyl, polyfumarate, a fluoride resin, or the like can be used. Moreover, a mixture of a plurality of organic resin materials may also be used.

In the case of forming the dielectric layer 110 with a mixture of ceramic and an organic resin, it is preferable to form the dielectric layer 110 in such a way that ceramic particles are dispersed in the organic resin. Here, the content of the ceramic particles in the dielectric layer 110 is preferably 20 vol % or more and 60 vol % or less. Moreover, the diameter of the ceramic particle preferably ranges from 1 to 50 μm.

The dielectric constant of the dielectric layer 110 desirably ranges from 2.6 to 150, more preferably 2.6 to 40. By using a ferroelectric material having a high dielectric constant, it is possible to decrease the capacitance of the patch antenna.

The first conductive layer 111, the second conductive layer 112, and the power feeding layer 113 of the patch antenna can be formed of a metal selected from gold, silver, copper, palladium, platinum, or aluminum; an alloy including the metal; or the like. The first conductive layer 111, the second conductive layer 112, and the power feeding layer 113 of the patch antenna can be formed by printing or plating. Each of these conductive layers can be formed by forming a conductive film over the dielectric layer by evaporation, sputtering, or the like and partially etching the conductive film thereafter.

The patch antenna is preferably has a size of several mm×several mm to several tens of mm×several tens of mm. Typically, the size is 7 mm×7 mm to 12 mm×12 mm. Further, the thickness of the patch antenna is 1 mm to 15 mm, typically, 1.5 mm to 5 mm. The patch antenna is preferably a rectangular flat plate; however, the shape is not limited thereto. A circular flat plate can also be used.

The patch antenna will be described with reference to FIGS. 7A to 7D.

Figure 7A:
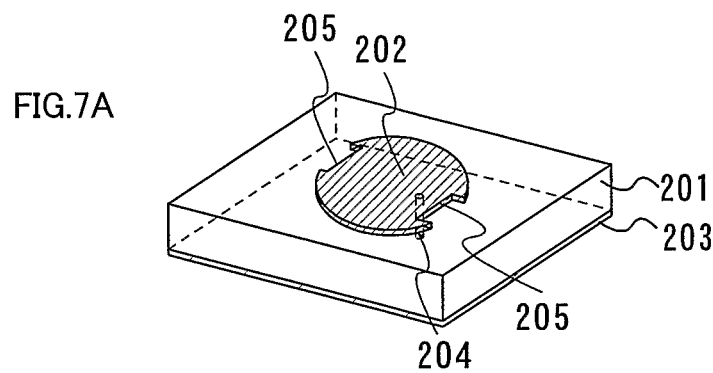
FIGS. 7A to 7D are perspective views each showing a patch antenna applicable to the present invention.

FIG. 7A shows a patch antenna having a first conductive layer 202 serving as a radiating electrode, a dielectric layer 201, a second conductive layer 203 serving as a ground contact body, a power feeding point 204, a power feeder formed in through holes provided in the first conductive layer, the dielectric layer, and the second conductive layer and connected to the power feeding point. The power feeder connects to the first conductive layer at the power feeding point; however, it does not connect to the second conductive layer. The patch antenna is a circularly-polarized wave antenna if the first conductive layer 202 serving as a radiating electrode is circular and a degenerate separation element 205 presents in each of two regions which are symmetric about a point. Meanwhile, if the first conductive layer 202 is circular, the patch antenna is a linearly-polarized wave antenna.

Figure 7B:
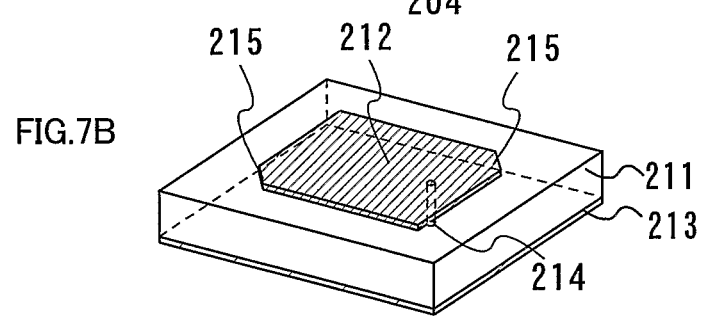

FIG. 7B shows a patch antenna having a first conductive layer 212 serving as a radiating electrode, a dielectric layer 211, a second conductive layer 213 serving as a ground contact body, a power feeding point 214, a power feeder formed in through holes provided in the first conductive layer, the dielectric layer, and the second conductive layer and connected to the power feeding point. The power feeder connects to the first conductive layer at the power feeding point; however, it does not connect to the second conductive layer. The patch antenna is a circularly-polarized wave antenna if the first conductive layer 212 serving as a radiating electrode is rectangular and a degenerate separation element 215 presents in each of two regions which are symmetric about a point. Meanwhile, if the first conductive layer 212 is rectangular, the patch antenna is a linearly-polarized wave antenna.

Figure 7C:
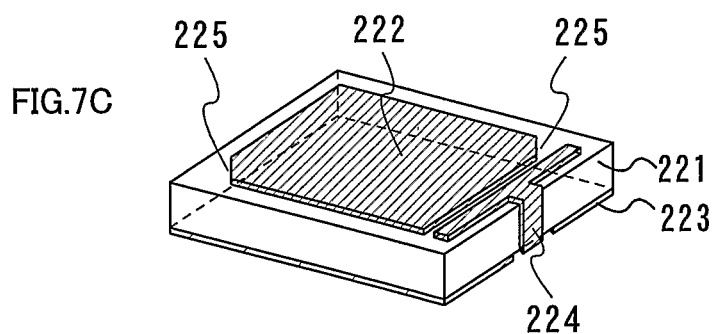

FIG. 7C shows a patch antenna having a first conductive layer 222 serving as a radiating electrode, a dielectric layer 221, a second conductive layer 223 serving as a ground contact body, and a power feeding layer 224. The patch antenna is a circularly-polarized wave antenna if the first conductive layer 222 serving as a radiating electrode is rectangular and the degenerate separation element 225 presents in two regions which are symmetric about a point. Meanwhile, if the first conductive layer 222 is rectangular without the degenerate separation element 225, the patch antenna is a linearly-polarized wave antenna. The first conductive layer 222 serving as a radiating electrode and the power feeding layer 224 are capacitance-coupled through a gap. Moreover, since the power feeding layer 224 is formed on a side surface of the dielectric layer, surface mount is possible.

Since the patch antennas shown in FIGS. 7A to 7C are provided with the second conductive layers 203, 213, and 223 serving as ground contact bodies on one surfaces of the dielectric layers 201, 211, and 221, the patch antennas have directivity on the first conductive layers 202, 212, and 222 side.

Figure 7D:
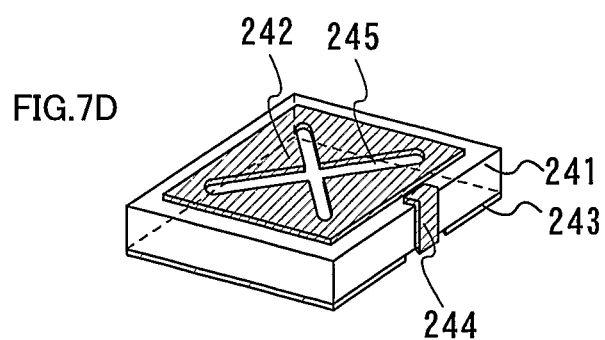

FIG. 7D shows a patch antenna having a first conductive layer 242 serving as a radiating electrode, a dielectric layer 241, a second conductive layer 243 serving as a ground contact body, and a power feeding layer 244. As shown in FIG. 7D, in the first conductive layer 242, orthogonal slits are formed on diagonal lines. In other words, crisscross cutouts are provided in the first conductive layer 242 serving as the radiating electrode. Therefore, the dielectric layer 241 is exposed in the crisscross part. The first conductive layer 242 serving as a radiating electrode and the power feeding layer 244 are capacitance-coupled through a gap. As a typical example of the patch antenna having such a shape, CABPB 1240, CABPB 0730, and CABPB 0715 (manufactured by TDK Corporation) are given. Moreover, since the power feeding layer 244 is formed on a side surface of the dielectric layer, surface mount is possible. Since the patch antenna having such a structure has non-directivity due to the orthogonal slits of the radiating electrode, a place of mount and an angle of mount are not necessarily selected. Thus, the degree of freedom in designing electronic devices can be broadened.

A known patch antenna other than the patch antennas shown in FIGS. 7A to 7D can also be used.

By using a patch antenna of a circularly polarized wave, it is possible to carry out transmission/reception such as third-generation data communication, packet communication, and transmission/reception of GPS (Global Positioning System (1.5 GHz)), satellite digital broadcast (2.6 GHz), PAN (Personal Area Network) such as wireless LAN (Local Area Network) (2.4 GHz, 5.2 GHz), a wireless communication technology for connecting information appliances (Bluetooth (registered trademark) (2.4 GHz)), or UWB (Ultra Wide Band) (3 to 10 GHz), and the like.

As shown in FIG. 1B, a plurality of layers 121 to 123 each having a plurality of thin film transistors may be stacked in the layer 120 having thin film transistors. Specifically, the second layer 122 having thin film transistor is formed over a first layer 121 having thin film transistors. A third layer 123 having thin film transistors is formed over the second layer 122 having thin film transistors. In the third layer 123 having thin film transistors, an insulating layer 127 is formed over a thin film transistor. Further, on a surface of the insulating layer 127, a connection terminal 126 connected to whichever of the thin film transistors in the first layer having thin film transistors to the third layer having thin film transistors is formed.

In the first layer 121 having thin film transistors, a first insulating layer 124 is formed over thin film transistors. With the use of the first insulating layer 124, the thin film transistors in the first layer 121 having thin film transistors are electrically isolated from thin film transistors in the second layer 122 having thin film transistors. Further, in the second layer 122 having thin film transistors, a second insulating layer 125 is formed over thin film transistors. With the use of the second insulating layer 125, thin film transistors in the second layer 122 having thin film transistors are electrically isolated from thin film transistors in the third layer 123 having thin film transistors. With the use of the third layer 123 having thin film transistors, a third insulating layer 127 is formed over thin film transistors. In the third insulating layer 127, thin film transistors in the third layer 123 having thin film transistors is electrically isolated from the connection terminal.

The first layer having a thin film transistor to the third layer having a thin film transistor are shown as the layer 120 having thin film transistors in FIG. 1B; however, the present invention is not limited to this. The layer 120 having thin film transistors may include two layers having thin film transistors. Further, the layer 120 having thin film transistors may include four or more layers having thin film transistors.

Figure 3A:
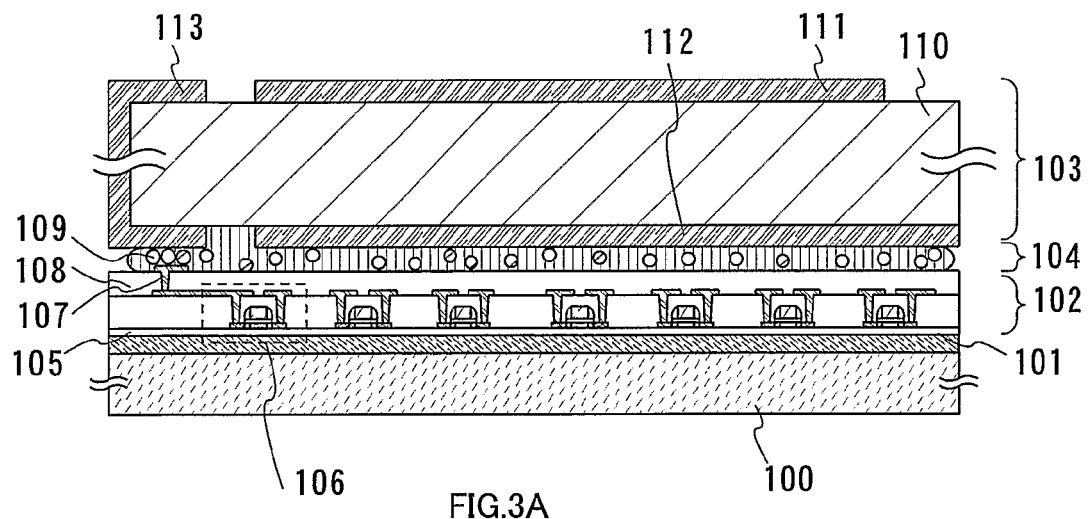
FIGS. 3A and 3B are cross-sectional views each showing a wireless chip of the present invention.

As shown in FIG. 3A, the layer 102 having thin film transistors may be secured to a flexible substrate 100 with an organic resin layer 101 therebetween. As a typical example of the flexible substrate 100, a thin and light plastic substrate is preferably used. Typically, PET (polyethylene terephthalate), PEN (polyethylene naphthalate), PES (polyether sulfone), polypropylene polycarbonate, polyether-imide, polyphenylene sulfide, polyphenylene oxide, polysulfone, polyphthalamide, or the like can be used. Further, a film-coated paper such as a release paper can be used for the flexible substrate 100.

Further, as a typical example of the organic resin layer 101, an organic resin which is a hardened reactive adhesive of a thermosetting adhesive, a polymeric adhesive, a pressure adhesive, a hot melt adhesive, or the like is preferably used. Generally, phenol resin, epoxy resin, silicone resin, acrylic resin, polyester resin, silicon resin, or the like can be used.

Note that, in the case where an adhesion resin layer is provided on a flexible substrate 100, the flexible substrate can be secured to the layer 102 having thin film transistors.

Note that, here, a wireless chip in which a flexible substrate is provided on the layer 102 having thin film transistors which is shown in FIG. 1A with an organic resin therebetween; however, the structure is not limited thereto. The flexible substrate may be provided on a plurality of layers having thin film transistors with an organic resin therebetween as shown in FIG. 1B.

Figure 3B:
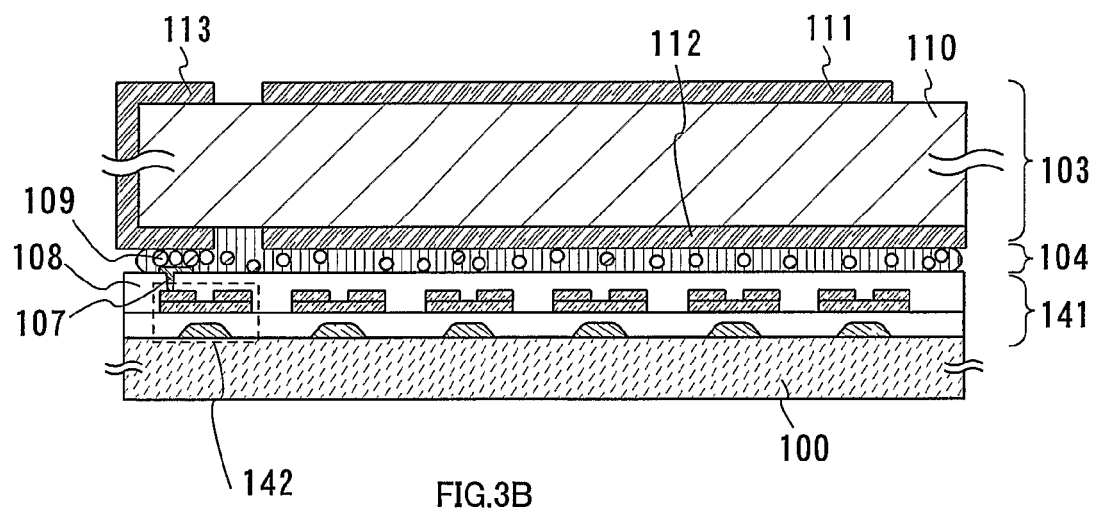

Further, as shown in FIG. 3B, a layer 141 having thin film transistors formed over a flexible substrate 100 and the antenna 103 may be fixed with an anisotropic conductive adhesive 104.

The connection terminal 107 formed on the surface of the layer 141 and the power feeding layer 113 are electrically connected through the conductive particles 109 in the anisotropic conductive adhesive. Although not shown, the ground electrode of the circuit including the thin film transistors and a conductive layer 112 of the antenna are electrically connected through the conductive particles in a similar manner.

The flexible substrate 100 has lower heat resistance compared with a non-flexible substrate such as a glass substrate. Accordingly, the thin film transistors are preferably formed using an organic semiconductor. As to the layer having thin film transistors formed of an organic semiconductor, a thin film transistor 142 is formed over the flexible substrate 100, and an insulating layer 108 covering the thin film transistor 142 is formed. Further, the connection terminal 107 connected to a wiring of the thin film transistor 142 is formed on the surface of the layer 141 having thin film transistors.

Figure 17A:
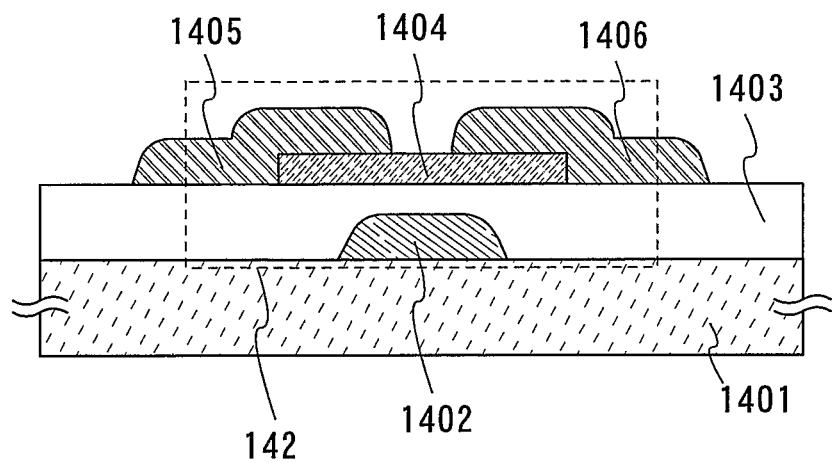
FIGS. 17A and 17B are cross-sectional views each showing a thin film transistor applicable to the present invention.

Here, a structure of a thin film transistor using an organic semiconductor will be described with reference to FIGS. 17A and 17B. FIG. 17A shows an example of applying a staggered thin film transistor. The thin film transistor 142 is provided over the flexible substrate 1401. In the thin film transistor 142, a gate electrode 1402, an insulating layer 1403 serving as a gate insulating film, a semiconductor layer 1404 overlapping the gate electrode and the insulating layer 1403 serving as a gate insulating film, wirings 1405 and 1406 connected to the semiconductor layer 1404 are formed. Note that, the semiconductor layer is in contact with the insulating layer 1403 serving as a gate insulating film and the wirings 1405 and 1406.

The gate electrode 1402 can be formed using the same material and the same method as the gate electrode 1304. Further, the gate electrode 1402 can be formed by using a method in which a pattern having a predetermined shape is formed by discharging droplets of a composite containing particles from minute openings (hereinafter referred to as a droplet discharge method) and by drying and baking thereafter. Further, printing is carried out with a paste containing particles on the flexible substrate by a printing method, and drying and baking is carried out to form the gate electrode 1402. The particles are typified by particles mainly containing any one of gold, copper, an alloy of gold and silver, an alloy of gold and copper, an alloy of silver and copper, an alloy of gold, silver, and copper any one. Further, particles mainly containing a conductive oxide such as indium tin oxide (ITO) may be used.

The insulating layer 1403 serving as a gate insulating film can be formed using the same material and the same method as the insulating layer 1303. Note that, in the case where the insulating layer is formed by heat treatment after applying an insulating material dissolved in an organic solvent, the heat treatment is carried out at a temperature lower than the heat resistance temperature of the flexible substrate.

The semiconductor layer 1404 may be a polycyclic aromatic compound, a conjugated double bond compound, phthalocyanine, a charge-transfer complex, or the like. For example, anthracene, tetracene, pentacene, 6T(hexathiophene), TCNQ (tetracyanoquinodimethane), PTCDA (perylenetetracarboxylic dianhydride), naphthalenetetracarboxylic dianhydride (NTCDA), or the like can be used. Specifically, a π-conjugated polymer material, a carbon nanotube, polyvinyl pyridine, a phthalocyanine metal complex, or the like can be used as an organic polymer compound material. In particular, it is preferable to use polyacetylene, polyaniline, polypyrrole, polythienylene, a polythiophene derivative, poly(3 alkylthiophene), a polyparaphenylene derivative, or a polyparaphenylene vinylene derivative, which is a π-conjugated polymer material whose skeleton is formed with conjugated double bonds.

Further, the organic semiconductor film may be formed by a manner in which a film having a uniform film thickness. The film thickness is 1 nm or more and 1000 nm or less, and preferably 10 nm or more and 100 nm or less is desirable. As a specific method, vapor deposition, coating, spin coating, a barcode method, solution casting, dip coating, screen printing, roll coating, or a droplet discharge method can be used.

The wirings 1405 and 140 can be formed using the same material and method as the gate electrode 1402.

Figure 17B:
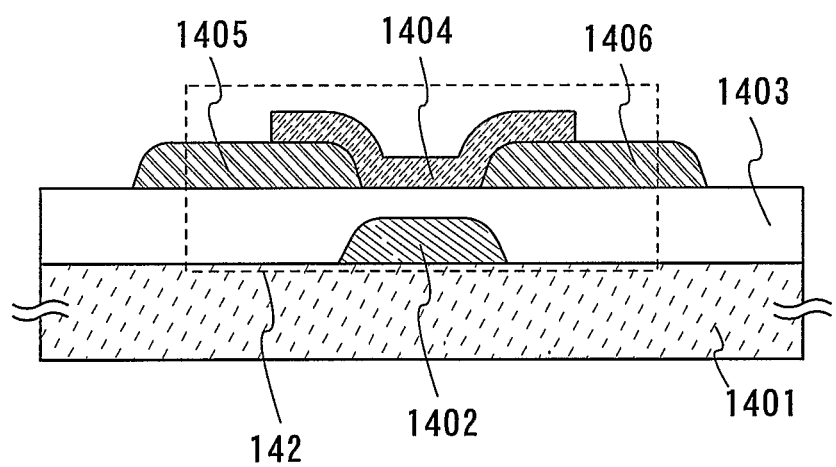

FIG. 17B shows an example of applying a co-planar thin film transistor. The thin film transistor 142 is provided over the flexible substrate 1401. In the thin film transistor 142, the gate electrode 1402, the insulating layer 1403 serving as a gate insulating film, the wiring 1405 and 1406, and a semiconductor layer 1404 overlapping the gate electrode and the insulating layer 1403 serving as a gate insulating film are formed. Further, the wirings 1405 and 1406 are in contact with the gate electrode and the insulating layer 1403 serving as a gate insulating film and the semiconductor layer 1404.

Figure 9A:
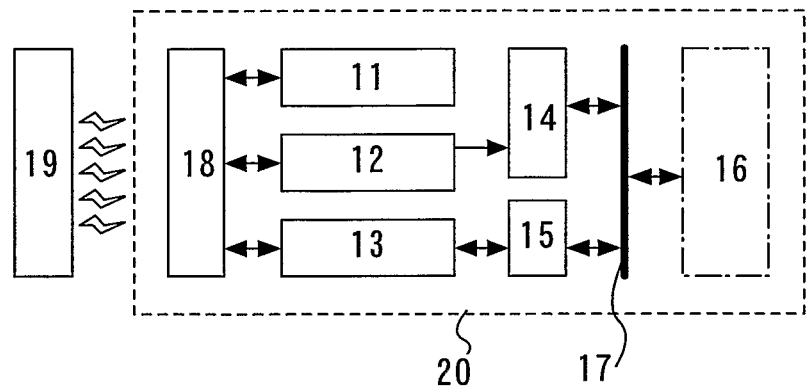
FIGS. 9A to 9C each show a wireless chip of the present invention.

Here, the structure of a wireless chip of the present invention is described with reference to FIGS. 9A to 9C and FIG. 10. As shown in FIG. 9A, a wireless chip 20 of the present invention has a function to send and receive data without contact, and includes a power source circuit 11, a clock generating circuit 12, a data modulation/demodulation circuit 13, a control circuit 14 which controls other circuits, an interface circuit 15, a memory circuit 16, a bus 17, and an antenna 18.

Figure 9B:
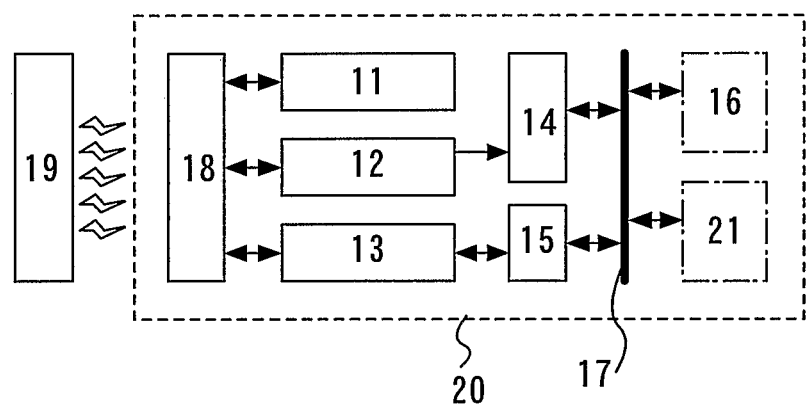

Further, as shown in FIG. 9B, the wireless chip 20 of the present invention has a function to send and receive data without contact, and may have a central processing unit 21, in addition to the power source circuit 11, the clock generating circuit 12, the data modulation/demodulation circuit 13, the control circuit 14 which controls other circuits, the interface circuit 15, the memory circuit 16, the bus 17, and the antenna 18.

Figure 9C:
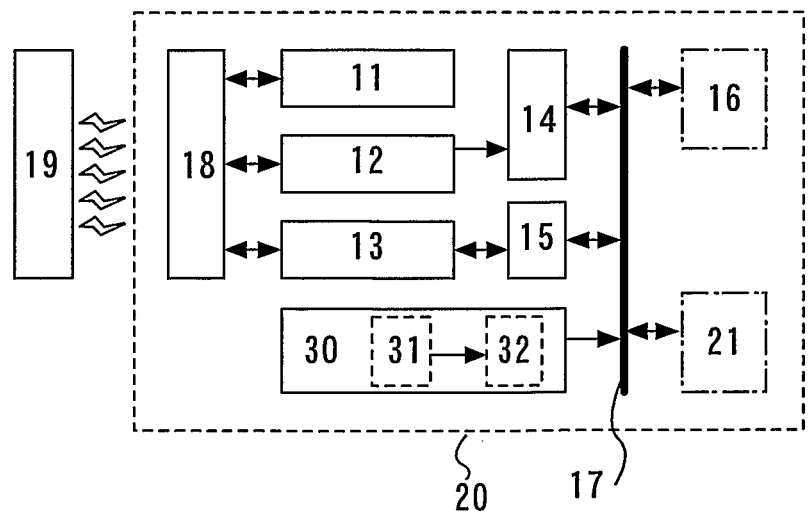

Moreover, as shown in FIG. 9C, the wireless chip 20 of the present invention has a function to send and receive data without contact, and may have a detection portion 30 including a detection element 31 and a detection control circuit 32, in addition to the power source circuit 11, the clock generating circuit 12, the data modulation/demodulation circuit 13, the control circuit 14 which controls other circuits, the interface circuit 15, the memory circuit 16, the bus 17, the antenna 18, and the central processing unit 21.

As to a wireless chip of this embodiment mode, the detection portion 30 including the detection element 31 and the detection control circuit 32 and the like are formed in addition to the power source circuit 11, the clock generating circuit 12, the data modulation/demodulation circuit 13, the control circuit 14 which controls another circuit, the interface circuit 15, the memory circuit 16, the bus 17, the antenna 18, and the central processing unit 21, using the layers 102, 120, and 141 having thin film transistors. Thus, a compact multi-functional wireless chip can be formed.

The power source circuit 11 is a circuit which generates various power sources to be supplied to respective circuits in the wireless chip 20 based on an alternating signal inputted from the antenna 18. The clock generating circuit 12 is a circuit which generates various clock signals to be supplied to respective circuits in the wireless chip 20 based on an alternating signal inputted from the antenna 18. The data modulation/demodulation circuit 13 has a function to modulate/demodulate data to be sent to or received from a reader/writer 19. The control circuit 14 has a function to control the memory circuit 16. The antenna 18 has a function to send and receive an electric field or an electric wave to and from the reader/writer 19. The reader/writer 19 has a function to exchange data with the wireless chip, control the wireless chip, and control the process of the data sent to or received from the wireless chip. The wireless chip is not limited to the above structure, and for example, another element such as a limiter circuit of power source voltage or hardware dedicated for cryptographic processing may be added.

The memory circuit 16 has one or a plurality of elements selected from a DRAM, an SRAM, an FeRAM, a mask ROM, a PROM, an EPROM, an EEPROM, a flash memory, or an organic memory.

An organic memory has a layer containing an organic compound between a pair of electrodes. Further, an organic memory has, between a pair of electrodes, a layer in which an organic compound and an inorganic compound are mixed. As a typical example of the organic compound, a substance whose shape, conductivity, or crystal state changes by an electric action or light irradiation is used. Typically, a conjugate a polymer doped with a compound generating acid in absorbing light (photoacid generator), an organic compound having a high hole-transporting property, or an organic compound having a high electron-transporting property can be used.

In the case of providing a mixed layer of an organic compound and an inorganic compound between a pair of electrodes, it is preferable to mix an organic compound having a high hole-transporting property and an inorganic compound which easily receives electrons. Moreover, it is preferable to mix an organic compound having a high electron-transporting property and an inorganic compound which easily donates electrons. With such a structure, many hole carriers or electron carriers generate in an organic compound originally having almost no carriers intrinsically, so that the organic compound displays an extremely high hole-injecting/transporting property or electron-injecting/transporting property.

Since an organic memory can achieve reduction in size and film thickness, as well as the increase in capacitance simultaneously, the wireless chip can be more compact and lighter by forming the memory circuit 16 using the organic memory.

A mask ROM can be formed at the same time as the thin film transistor. The mask ROM is formed with a plurality of transistors. At this time, data can be written depending on whether opening or not opening a contact hole for a wiring connecting to, for example, a drain region of the transistor. For example, data (information) of 1 (ON) in the case of opening the contact hole and data (information) of 0 (OFF) in the case of not opening the contact hole can be written in a memory cell.

For example, a part of a photoresist formed over the interlayer insulating layer 108 over the thin film transistor 106 shown in FIG. 1A where the contact hole is to be provided is irradiated with an electron beam or a laser, before or after a step of exposing the photoresist to light through a reticle (photomask) using a light-exposure apparatus such as a stepper. After that, the steps of developing, etching, peeling the photoresist, and the like are conducted as usual to form a wiring. This makes it possible to independently form a pattern where the contact hole is provided and a pattern where the contact hole is not provided only by selecting regions to be irradiated with the electron beam or the laser, without changing the reticle (photomask). In other words, by selecting the region to be irradiated with the electron beam or the laser, a mask ROM in which different data are written for each of semiconductor device at a time of production can be manufactured.

A Unique Identifier (UID) and the like for each semiconductor device or the like can be manufactured using such a mask ROM.

Figure 10:
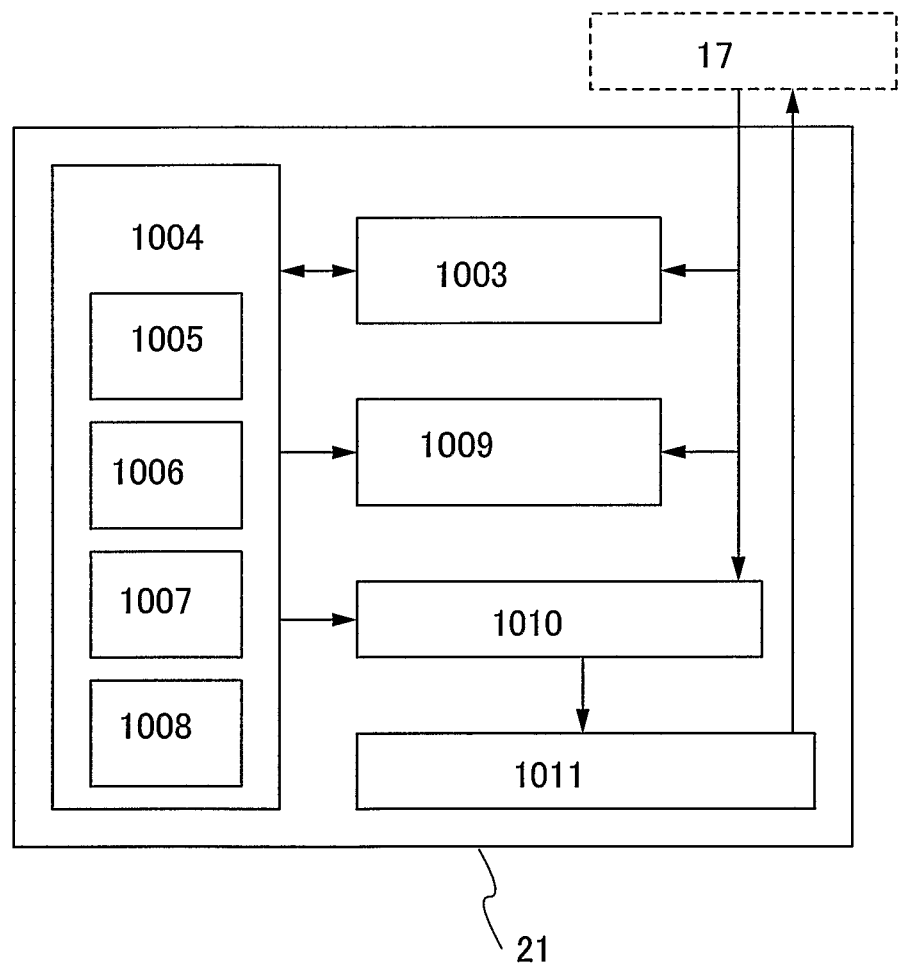
FIG. 10 shows a central processing unit applicable to the present invention.

Here, a structure of the central processing unit 21 will be described with reference to a block diagram of FIG. 10.

First, a signal is inputted to the bus 17, and then the signal is decoded in an analysis circuit 1003 (also referred to as an instruction decoder), and the decoded signal is inputted into a control signal generating circuit 1004 (CPU timing controller). Upon the input of the signal, a control signal is outputted from the control signal generating circuit 1004 to an arithmetic circuit (hereinafter referred to as an ALU 1009) and a memory circuit (hereinafter referred to as a register 1010).

The control signal generating circuit 1004 includes an ALU controller (hereinafter referred to as ACON 1005) for controlling the ALU 1009, a circuit (hereinafter referred to as RCON 1006) for controlling the register 1010, a timing controller (hereinafter referred to as TCON 1007) for controlling timing, and an interrupt controller (hereinafter referred to as ICON 1008) for controlling interruption.

Meanwhile, after a process signal is inputted into the bus 17, the signal is outputted to the ALU 1009 and the register 1010. Then, a process based on the control signal inputted from the control signal generating circuit 1004 (such as a memory read cycle, a memory write cycle, an I/O read cycle, an I/O write cycle, or the like) is conducted.

The register 1010 includes a general-purpose register, a stack pointer (SP), a program counter (PC), and the like.

An address controller 1011 outputs a 16-bit address to the bus 17.

The structure of the CPU shown in this embodiment does not limit the structure of the present invention. A structure of a known CPU other than the above structures may also be employed.

The detection portion 30 can detect temperature, pressure, flow rate, light, magnetism, acoustic wave, acceleration, humidity, gas component, liquid component, and other characteristics by a physical or chemical means. Moreover, the detection portion 30 has the detection element 31 for detecting a physical amount or a chemical amount and the detection control circuit 32 for converting the physical amount or the chemical amount detected by the detection element 31 into an appropriate signal such as an electric signal. As the detection element 31, it is possible to use a resistor element, a capacitance-coupled element, an inductively-coupled element, a photoelectromotive element, a photoelectric conversion element, a thermoelectromotive element, a transistor, a thermistor, a diode, an electrostatic capacitance element, a piezoelectric element, or the like. The number of detection portions 30 may be more than one and in such a case, it is possible to detect a plurality of physical amounts or chemical amounts simultaneously.

The physical amount here means temperature, pressure, flow rate, light, magnetism, acoustic wave, acceleration, humidity, and the like, while the chemical amount means a chemical substance such as a gas constituent or a liquid constituent like ions, or the like. In addition, an organic compound such as a particular biological substance included in blood, sweat, urine, or the like (for example, blood-sugar level in the blood) is also included. In particular, in the case of detecting the chemical amount, since a particular substance needs to be selectively detected, a substance which selectively reacts with the substance to be detected is provided in advance in the detection element 31. For example, in the case of detecting a biological substance, it is preferable to fix, to a polymer or the like, enzyme, an antibody molecule, a microbial cell, or the like which selectively reacts with the biological substance to be detected by the detection element 31.

At the communication between the reader/writer and the wireless chip, it is possible to detect temperature, pressure, flow rate, light, magnetism, acoustic wave, acceleration, humidity, gas constituent, liquid constituent, and other characteristics, by using the detection portion 30. A film-shaped secondary battery may be used for the wireless chip. As a typical example of the film-like secondary battery, a thin secondary battery having gel to which an electrolysis solution has penetrated can be used. In this case, even when the communication is not made with the reader/writer, the above characteristics can be detected by using the detection portion 30.

In the wireless chip of the present embodiment mode, the antenna and the layer having the thin film transistor can be formed to have almost the same area. The patch antenna serves as a protector for the layer having thin film transistors. Therefore, the mechanical strength of the wireless chip increases.

Embodiment Mode 2

Figure 2:
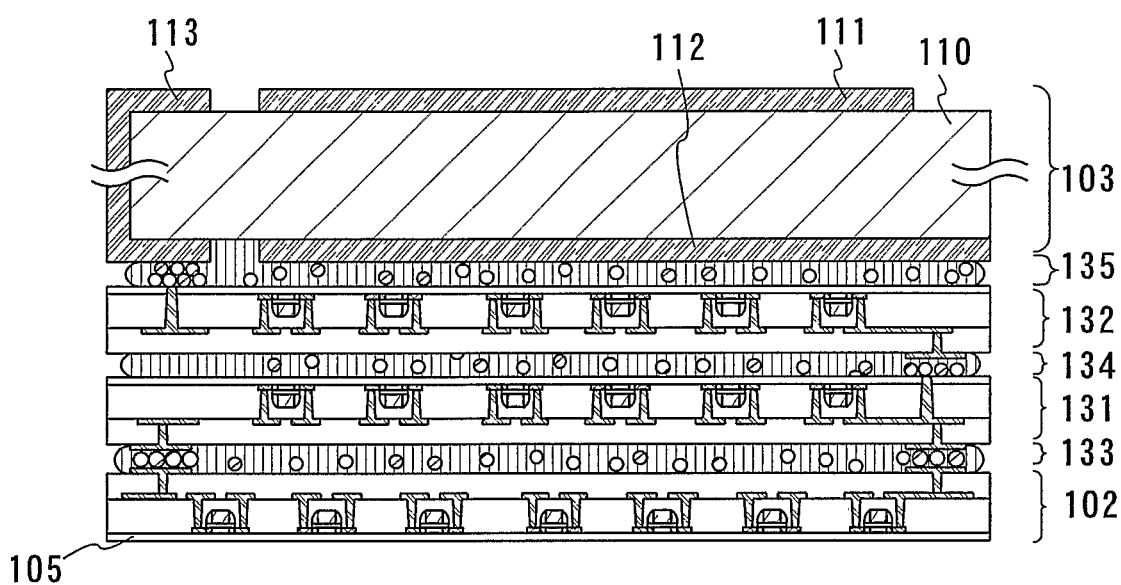
FIG. 2 is a cross-sectional view showing a wireless chip of the present invention.

An embodiment mode of a wireless chip of the present invention will be shown in FIG. 2. FIG. 2 is a cross-sectional view of a wireless chip. In this embodiment mode, a structure of a wireless chip which has a patch antenna and a plurality of layers having thin film transistors wherein the layers are fixed to each other with an anisotropic conductive adhesive will be described.

In a wireless chip of this embodiment mode, a first layer 102 having a thin film transistor and a second layer 131 having a thin film transistor are fixed to each other with an anisotropic conductive adhesive 133.

A first connection terminal formed on the surface of the first layer 102 having a thin film transistor is electrically connected to a second connection terminal formed on the surface of the second layer 131 having a thin film transistor through conductive particles dispersed in the anisotropic conductive adhesive 133.

Similarly to the first layer 102 having a thin film transistor and the second layer 131 having a thin film transistor, the second layer 131 having a thin film transistor and a third layer 132 having a thin film transistor are fixed to each other with an anisotropic conductive adhesive 134.

A third connection terminal formed on the surface of the second layer 131 having a thin film transistor is electrically connected to a fourth connection terminal formed on the surface of the third layer 132 having a thin film transistor, through conductive particles dispersed in the anisotropic conductive adhesive 134.

A compact and multi-functional wireless chip can be formed by forming any one of a processor unit, a power source circuit, a clock generating circuit, a data modulation/demodulation circuit, a control circuit, an interface circuit, a memory circuit, a detection circuit, and the like with the first layer 102 having a thin film transistor to the third layer 132 having a thin film transistor.

A fifth connection terminal formed on the surface of the third layer 132 having a thin film transistor is electrically connected to the antenna 103 through conductive particles in the anisotropic conductive adhesive. Although not shown here, a ground contact electrode of the circuit formed with the thin film transistor is electrically connected to the second conductive layer 112 of the antenna similarly through the conductive particles.

Although a wireless chip in which the first layer having a thin film transistor to the third layer having a thin film transistor are fixed to each other with the anisotropic conductive adhesive is shown, the present invention is not limited thereto, and two layers having thin film transistors may be used. Alternatively, four or more layers having thin film transistors may be used.

Further, the layer 102 having a thin film transistor may be fixed to a flexible substrate as in Embodiment Mode 1.

Further, this embodiment mode may be appropriately combined with Embodiment Mode 1.

In the wireless chip of this embodiment mode, the antenna and the layer having a thin film transistor formed over the insulating substrate can be formed to have almost the same area. A patch serves as a protector for the layer having a thin film transistor. Therefore, the mechanical strength of the wireless chip increases.

Moreover, since a plurality of layers having thin film transistors are fixed to the patch antenna in the wireless chip of this embodiment mode, the wireless chip is highly integrated.

Embodiment Mode 3

Figure 4:
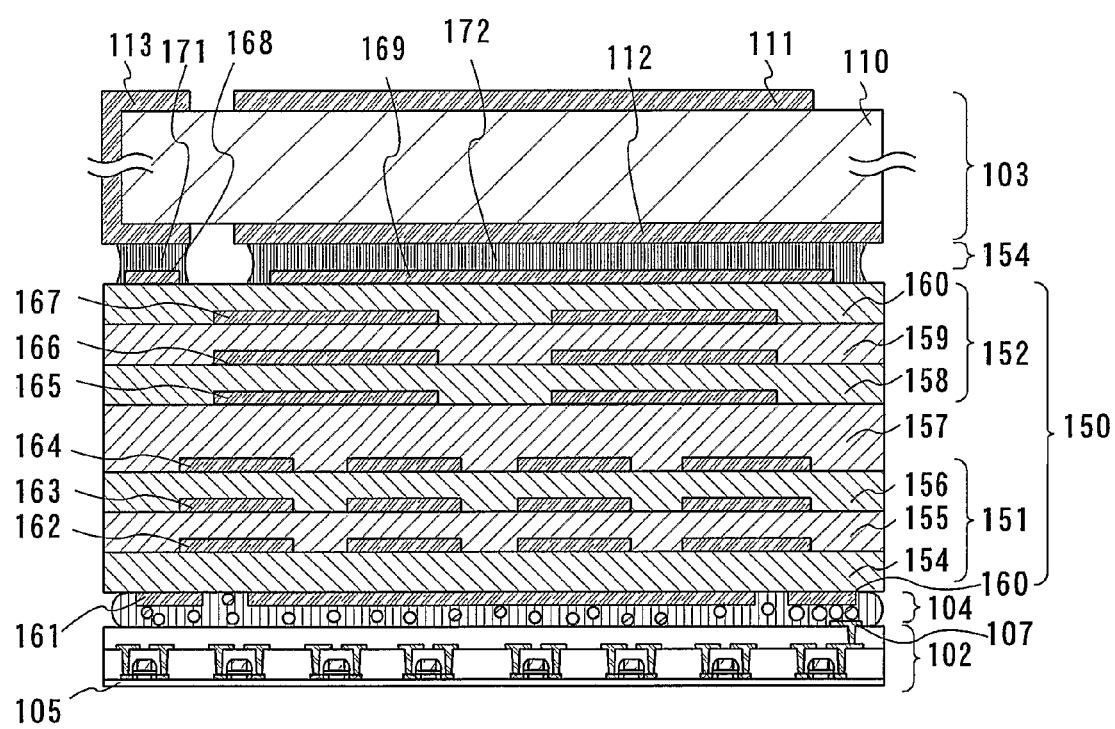
FIG. 4 is a cross-sectional view showing a wireless chip of the present invention.

An embodiment mode of a wireless chip of the present invention will be described with reference to FIG. 4. FIG. 4 is a cross-sectional view of a wireless chip. This embodiment mode will describe a structure of a wireless chip in which a layer having a thin film transistor, a passive element, and a patch antenna are fixed to each other with an anisotropic conductive adhesive, a conductive layer, or the like.

As shown in Embodiment Mode 1, the layer 102 having a thin film transistor is formed. The layer 102 having a thin film transistor and the passive element 150 are fixed to each other with the anisotropic conductive adhesive 104. Here, the passive element 150 is shown as a first passive element 151 and a second passive element 152. Further, the connection terminal 107 exposed at the surface of the layer 102 having a thin film transistor is electrically connected to a first connection terminal 160 of the passive element 150 by conductive particles in the anisotropic conductive adhesive 104.

The passive element 150 and the antenna 103 are fixed to each other by conductive layers 171 and 172. The power feeding layer 113 of the antenna 103, a second connection terminal 168 of the passive element 150, the second conductive layer 112 serving as a ground contact body of the patch antenna, and the third connection terminal 169 of the passive element are electrically connected respectively through the conductive layers 171 and 172. The conductive layers 171 and 172 are formed by curing a conductive paste. As a typical example of the conductive layer formed by curing a conductive paste, an alloy containing a plurality of elements selected from tin (Sn), silver (Ag), bismuth (Bi), copper (Cu), indium (In), nickel (Ni), antimony (Sb), or zinc (Zn) can be used. An anisotropic conductive adhesive can be used instead of the conductive layers 171 and 172.

The first passive element 151 includes one or more of a capacitor, an inductor, or a resistor using insulating layers 154 to 157 and conductive layers 162 to 164 provided therebetween. Similarly, the second passive element 152 includes one or more of a capacitor, an inductor, or a resistor using insulating layers 157 to 160 and the conductive layers 165 to 167 provided therebetween.

It is preferable that the dielectric constant of the insulating layers 154 to 160 of the first passive element 151 or the second passive element 152 range from 2.6 to 40. The conductive layers 162 to 167 are formed of a metal having high conductivity such as gold, silver, copper, or aluminum or alloy including a plurality of elements selected from these.

A method for forming the first passive element 151 and the second passive element 152 will be described below. A metal having high conductivity such as gold, silver, copper, or aluminum or an alloy including a plurality of elements selected from these metals is printed by a printing method on sheet-shaped ceramic including aluminum oxide and silicon oxide which has been formed (which is a so-called green sheet) to a thickness of 10 to 150 μm, thereby forming a conductive layer. If necessary, a through-hole may be formed in the green sheet and the through-hole may be filled with a conductive paste to form a plug for connecting to a conductive layer formed in another layer. The green sheet may be formed by appropriately mixing ceramic, an organic resin, or the like which forms the dielectric layer 110 of the antenna 103 shown in Embodiment Mode 1. A plurality of such green sheets where the conductive layer has been printed can be stacked and thermo-compressed, and then processed to have a predetermined size. After that, the insulating layer and the conductive layer can be baked at 800 to 1,300° C., thereby forming the first passive element 151 and the second passive element 152. Moreover, a conductive layer may be formed on a side surface of the insulating layer to connect to each conductive layer in the stack.

By combining a plurality of passive elements such as a capacitor, an inductor, a resistor, and a wiring, it is possible to form an antenna front-end module including a capacitor, a duplexer, and a low pass filter which form a high frequency circuit; an isolator power amplifier module including an isolator, a coupler, an attenuator, and a power amplifier; a VCO (voltage control oscillator); a band pass filter (BPF); a multilayer filter; a balun transformer; a dielectric filter; a coupler; a resonator; and the like.

A high frequency circuit such as a power source circuit, a clock generating circuit, a data modulation/demodulation circuit, a control circuit for controlling another circuit, an interface circuit, or a memory circuit; a bus; an antenna; a central processing unit; a detection portion including a detection element and a detection control circuit; and the like are formed using the layer having a thin film transistor and the passive element.

Further, the layer having thin film transistors may be fixed to a flexible substrate with an organic resin layer as in Embodiment Mode 1.

This embodiment mode can be appropriately combined with any one of Embodiment Modes 1 to 3.

The wireless chip of this embodiment mode includes an integrated circuit which is formed using a thin film transistor and the passive element formed with a thick film pattern. Therefore, each circuit is highly integrated using an element having appropriate functions. By mounting the wireless chip of the present invention onto a wiring substrate, the number of mount parts can be decreased. Thus, the area of the wiring substrate as well as the size of an electronic device having the wiring substrate can be reduced.

Embodiment Mode 4

Figure 5:
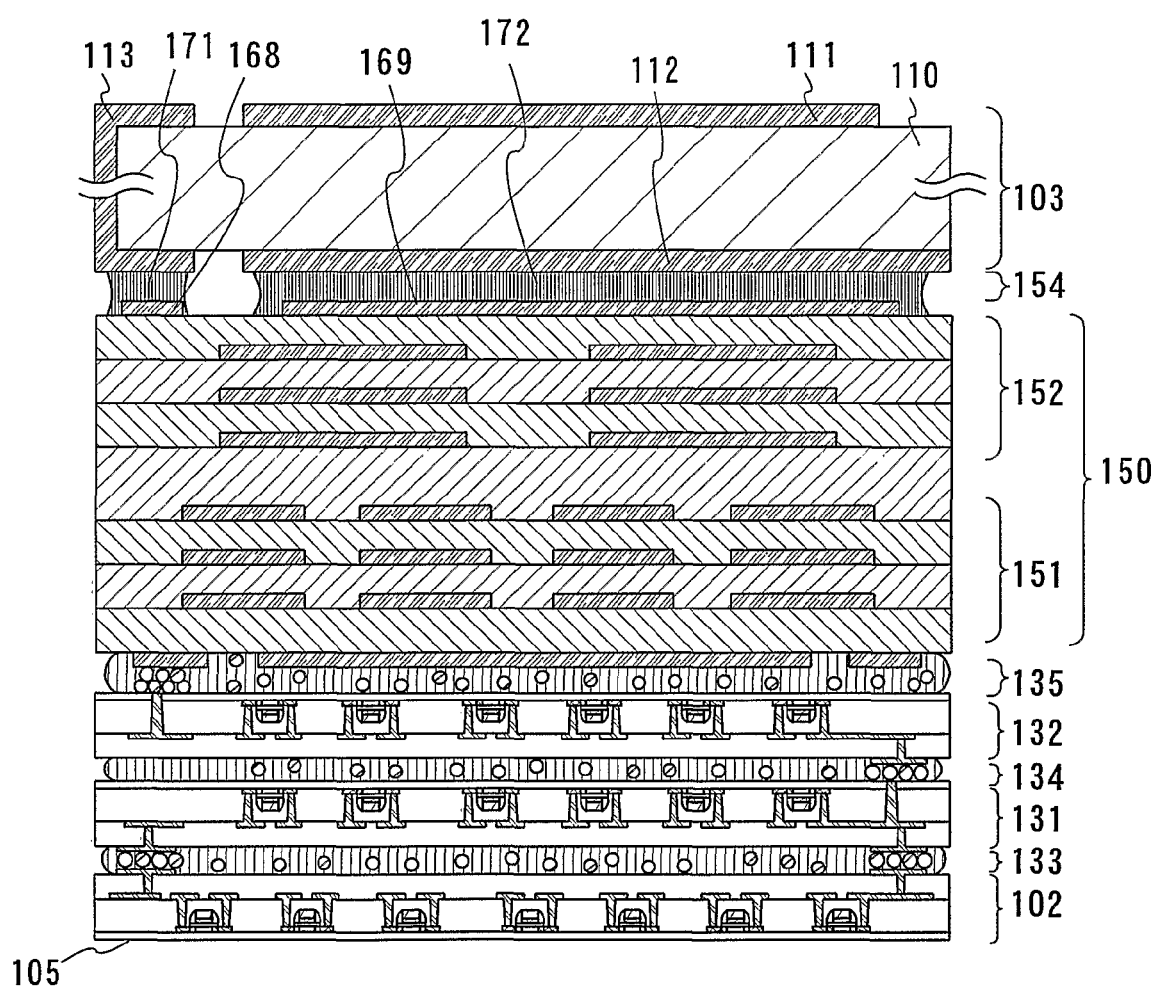
FIG. 5 is a cross-sectional view showing a wireless chip of the present invention.

An embodiment mode of a wireless chip of the present invention is shown in FIG. 5. FIG. 5 is a cross-sectional view of a wireless chip. This embodiment mode will describe a structure of a wireless chip in which a plurality of layers having thin film transistors which are fixed to each other with an anisotropic conductive adhesive, a passive element, and a patch antenna are fixed to each other with an anisotropic conductive adhesive, a conductive layer, or the like.

As in Embodiment Mode 2, the first layer 102 having a thin film transistor and the second layer 131 having a thin film transistor are fixed to each other with the anisotropic conductive adhesive 133.

The first connection terminal formed on the surface of the first layer 102 having a thin film transistor is electrically connected to the second connection terminal formed on the surface of the second layer having a thin film transistor, using the conductive particles dispersed in the anisotropic conductive adhesive 133.

Similarly to the first layer 102 having a thin film transistor and the second layer 131 having a thin film transistor, the second layer 131 having a thin film transistor and the third layer 132 having a thin film transistor are fixed to each other using the anisotropic conductive adhesive 134.

The third connection terminal formed on the surface of the second layer 131 having a thin film transistor is electrically connected to the fourth connection terminal formed on the surface of the third layer 132 having a thin film transistor, using the conductive particles dispersed in the anisotropic conductive adhesive 134.

The passive element 150 and the third layer 132 having a thin film transistor are fixed to each other using the anisotropic conductive adhesive 135. Here, the passive element 150 is shown as the first passive element 151 and the second passive element 152 similarly to Embodiment Mode 4. Moreover, the connection terminal exposed at the surface of the third layer 132 having a thin film transistor is electrically connected to the first connection terminal of the passive element 150 using the conductive particles in the anisotropic conductive adhesive.

As in Embodiment Mode 4, the passive element 150 and the antenna 103 are fixed to each other by the conductive layers 171 and 172. The power feeding layer 113 of the antenna 103, the second connection terminal 168 of the passive element 150, the second conductive layer 112 serving as a ground contact body of the patch antenna, and the third connection terminal 169 of the passive element are electrically connected respectively through the conductive layers 171 and 172. The conductive layers 171 and 172 are formed by curing conductive paste. An anisotropic conductive adhesive can be used instead of the conductive layers 171 and 172.

Further, the layer having thin film transistors may be fixed to a flexible substrate with an organic resin layer as in Embodiment Mode 1.

This embodiment mode can be appropriately combined with any one of Embodiment Modes 1 to 4.

The wireless chip of this embodiment mode includes an integrated circuit which is formed using the thin film transistor and the passive element formed with a thick film pattern. Therefore, since each circuit is formed using an element having appropriate functions, the wireless chip is highly integrated. By mounting the wireless chip of the present invention onto a wiring substrate, the number of mount parts can be decreased. Thus, the area of the wiring substrate as well as the size of an electronic device having the wiring substrate can be reduced.

Embodiment Mode 5

Figure 6A:
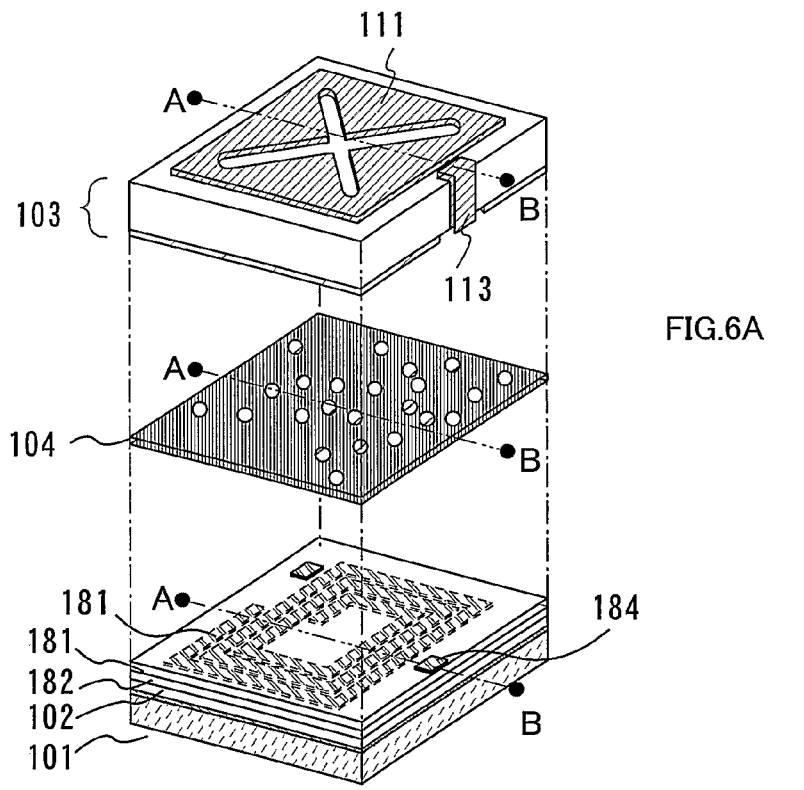
FIGS. 6A and 6B are a development view and a cross-sectional view, each showing a wireless chip of the present invention.
Figure 6B:
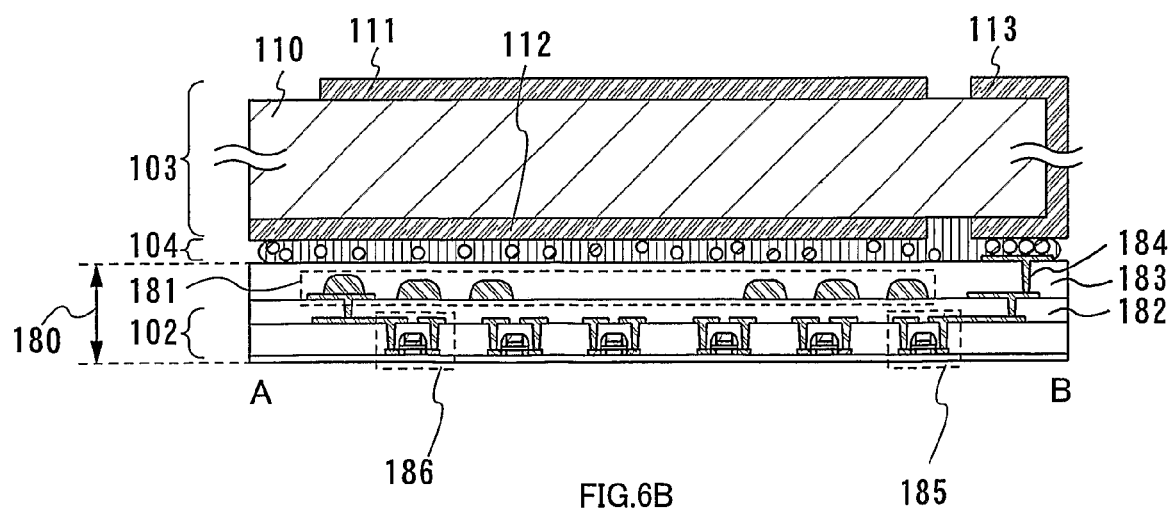

An embodiment mode of a wireless chip of the present invention is shown in FIGS. 6A and 6B. In this embodiment mode, an example of a wireless chip having a plurality of antennas will be shown. FIG. 6A is a development view of a wireless chip while FIG. 6B is a cross-sectional view taken along line A-B in FIG. 6A. This embodiment mode will describe a structure of a wireless chip having a plurality of antennas, particularly a wireless chip having a patch antenna and a layer having a first thin film transistor, a second thin film transistor, and a first antenna connected to thin film transistor.

As to the layer having a first thin film transistor, a second thin film transistor, and a first antenna connected to thin film transistor, an interlayer insulating layer 182 is formed over the layer 102 having a thin film transistor; a first antenna 181 is formed over the interlayer insulating layer 182; an insulating layer 183 is formed over the first antenna 181; and a connection terminal 184 is formed on a surface of the insulating layer 183.

The insulating layer 183 where the connection terminal 184 is exposed and the antenna 103 serving as a second antenna are fixed to each other with the anisotropic conductive adhesive 104. Further, the connection terminal 184 and the power feeding layer 113 of the patch antenna are electrically connected by the conductive particles dispersed in the anisotropic conductive adhesive 104. The connection terminal 184 is electrically connected to a first thin film transistor 185 formed. Moreover, a second thin film transistor 186 is connected to the first antenna 181.

The first antenna 181 is formed of a metal material containing aluminum, copper, or silver. For example, a paste-like composition of copper or silver can be formed by screen printing, off-set printing, or ink-jet printing. An aluminum film may be formed by sputtering and processed by etching. Further, an electroplating method or an electroless plating method may be used.

Figure 8A:
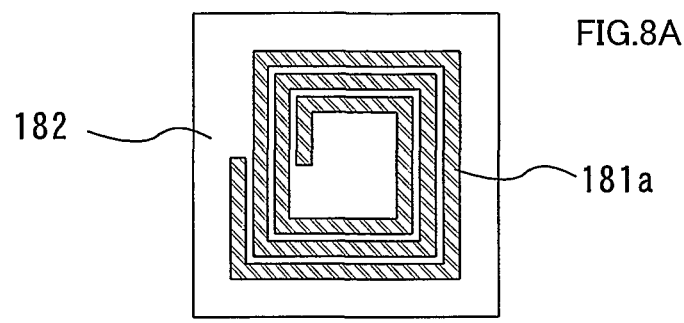
FIGS. 8A to 8C are top views each showing an antenna applicable to the present invention.

Here, the first antenna 181 has a shape of a square coil as shown in FIG. 8A.

Figure 8B:
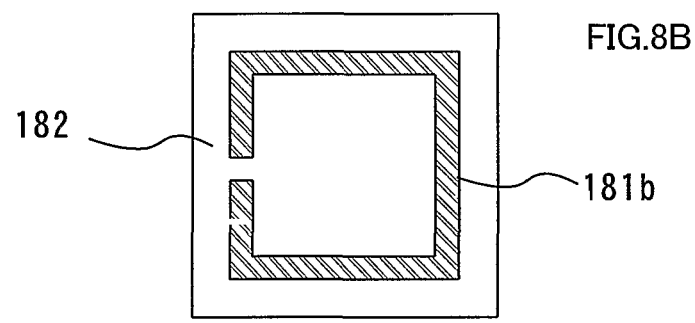
Figure 8C:
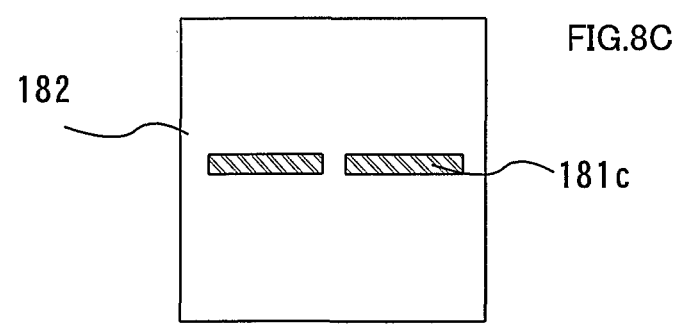

The shape of the first antenna 181 will be described with reference to FIGS. 8A to 8C. FIGS. 8A to 8C are top views showing the interlayer insulating layer 182 and an antenna formed over the interlayer insulating layer 182. Although the first antenna 181 in this embodiment mode has a square coil shape 181a as shown in FIG. 6A and FIGS. 8A and 8B, the shape is not limited to this. The antenna may have a circular coil shape. Further, as shown in FIG. 8B, the antenna can have a square loop shape 181b. The antenna can also have a circular loop shape. Alternatively, as shown in FIG. 8C, the antenna may have a linear-dipole shape 181c. The antenna may have a curved-dipole shape.

Further, as shown in FIGS. 18A and 18B, thin film transistors may be sandwiched between a plurality of antennas in the wireless chip.

Typically, as shown in FIG. 18A, a first connection terminal 191 is formed over a first surface of the 102 having a thin film transistor. Further, a second connection terminal 193 is formed on a second surface of the 102 having a thin film transistor, which opposes the first surface. Here, in the layer having a thin film transistor, a first thin film transistor 189 and a second thin film transistor 190 are formed over an insulating layer 105 and an insulating layer 192 is formed over the thin film transistors. The first connection terminal 101 is connected to a semiconductor layer of the thin film transistor 189 and exposed at a surface of the insulating layer 105. The second connection terminal 193 is connected to the thin film transistor 190 and exposed at a surface of the insulating layer 192.

The insulating layer 105 where the first connection terminal 191 is exposed and a patch antenna that is a first antenna 103a are fixed to each other with an anisotropic conductive adhesive 187. Further, the first connection terminal 191 and a power feeding layer 113a of the patch antenna which is the first antenna are electrically connected to each other with conductive particles dispersed in the anisotropic conductive adhesive.

The insulating layer 192 where the connection terminal 193 is exposed and a patch antenna that is a second antenna 103b are fixed to each other with an anisotropic conductive adhesive 104. Further, the second connection terminal 193 and a power feeding layer 113b of the patch antenna which is the second antenna are electrically connected to each other with conductive particles dispersed in the anisotropic conductive adhesive.

If the first antenna 103a and a second antenna 103b each have different frequency, a wireless chip applicable to multi band is obtained. Further, if one of the first antenna 103a and the second antenna 103b is an omnidirectional antenna and the other is a directional antenna, transmission and reception can be carried out by appropriately using several directivities of electric waves having different frequencies.

Furthermore, as shown in FIG. 18B, a wireless chip may have a layer 194 having first to third thin film transistors and a third antenna connected to the first thin film transistor, which is sandwiched between the patch antenna that is the first antenna 103a and the patch antenna that is the second antenna 103b.

In the layer 194 having the first to third thin film transistors and the third antenna connected to the first thin film transistor, the insulating layer 192 is formed over the first to third thin film transistors, the third antenna 197 is formed over the insulating layer 192, an insulating layer 198 is formed over the third antenna 197, and a connection terminal 199 is formed is formed on a surface of the insulating layer 198. The third antenna 197 is connected to the third transistor 195 through a conductive layer 196. The third antenna 197b can be formed in a similarly to the first antenna 181 shown in FIGS. 6A and 6B and FIGS. 8A and 8B.

The insulating layer 105 where the first connection terminal 191 is exposed and the patch antenna that is the first antenna 103a are connected to each other with the anisotropic conductive adhesive 187. Further, the first connection terminal 191 and the power feeding layer 113a of the patch antenna that is the first antenna are electrically connected to each other with conductive particles dispersed in the anisotropic conductive adhesive 187.

The insulating layer 198 where the second connection terminal 199 is exposed and the patch antenna that is the second antenna 103b are connected to each other with the anisotropic conductive adhesive 104. Further, the second connection terminal 199 and the power feeding layer 113b of the patch antenna that is the second antenna are electrically connected to each other with conductive particles dispersed in the anisotropic conductive adhesive 104.

If the first antenna 103a, the second antenna 103b, the third antenna 197 each have different frequency, a wireless chip applicable to multi band is obtained. Further, if one of the first antenna 103a and the second antenna 103b is an omnidirectional antenna and the other is a directional antenna, transmission and reception can be carried out by appropriately using several directivities of electric waves having different frequencies.

The wireless chip of this embodiment mode includes an integrated circuit which is formed using a thin film transistor and the passive element formed with a thick film pattern. Therefore, each circuit is highly integrated using an element having appropriate functions. By mounting the wireless chip of the present invention onto a wiring substrate, the number of mount parts can be decreased. Thus, the area of the wiring substrate as well as the size of an electronic device having the wiring substrate can be reduced.

Embodiment 1

In this embodiment, a method of manufacturing a wireless chip will be described with reference to FIGS. 19A to 19E and FIGS. 20A to 20C.

Figure 19A:
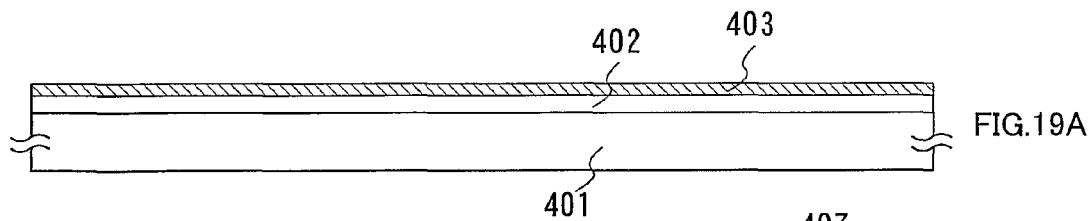
FIGS. 19A to 19E are cross-sectional views showing manufacturing steps of a wireless chip according to the present invention.

As shown in FIG. 19A, an insulating layer 402 and a separation layer 403 are formed over a surface of a substrate 401.

The substrate 401 may be a glass substrate, a quartz substrate, a metal substrate or a stainless substrate having a surface over which an insulating layer is formed, and the like. The insulating layer is formed by a known method (such as sputtering or plasma CVD) using silicon nitride, silicon oxynitride, silicon nitride oxide, or the like.

The separation layer 403 is formed by a known method (such as sputtering or plasma CVD) to have a single layer or stacked layers using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), iridium (Er), and silicon (Si), an alloy material mainly containing the elements, and/or a compound material mainly containing such elements. The layer containing silicon may have any of an amorphous structure, a microcrystalline structure, and a polycrystalline structure.

If the separation layer 403 has a layered structure, it is preferable to form a tungsten layer, a molybdenum layer, or a layer containing a mixture of tungsten and molybdenum as a first layer, and a layer containing an oxide, a nitride, an oxynitride, or a nitride oxide of tungsten, molybdenum, or a mixture of tungsten and molybdenum as the second layer.

If the separation layer 403 has a layered structure including a layer containing tungsten and a layer containing an oxide of tungsten, a layer containing silicon oxide may be formed over the layer containing tungsten, so that the layer containing an oxide of tungsten is formed at the interface between the tungsten layer and the silicon oxide layer. Further, the surface of the tungsten layer may be subjected to thermal oxidation treatment, oxygen plasma treatment, or a treatment using a strong oxidizing solution such as ozone water to form a layer containing an oxide of tungsten. The same applies to the case of forming a layer containing a nitride, an oxynitride or a nitride oxide of tungsten. After a layer containing tungsten is formed, a silicon nitride layer, a silicon oxynitride layer, or a silicon nitride oxide layer may be formed thereover.

In the aforementioned steps, the insulating layer 402 is formed between the substrate 401 and the separation layer 403; however, the invention is not limited to the structure. The separation layer 403 may be formed in contact with the substrate 401.

Here, a silicon oxynitride layer is used for the substrate 401, a silicon oxynitride layer with a thickness of 100 nm is formed by CVD as the insulating layer 402, and a tungsten layer with a thickness of 30 nm is formed by sputtering as the separation layer 403.

Figure 19B:
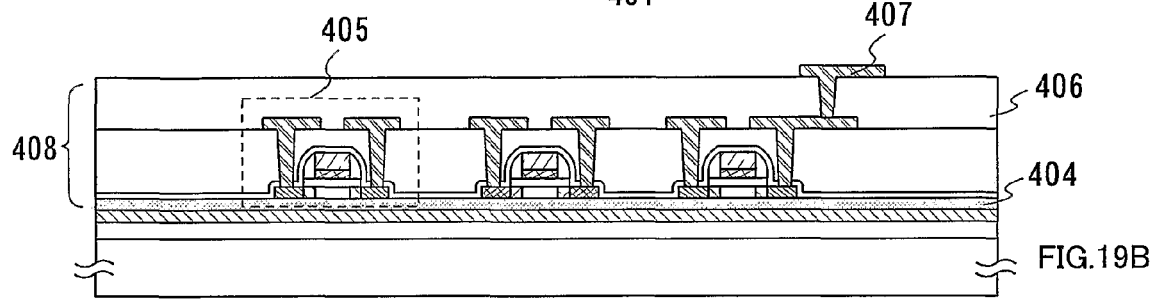

Subsequently, as shown in FIG. 19B, an insulating layer 404 is formed as a base film to cover the separation layer 403. In order to obtain the insulating layer 404, a single layer or stacked layers are formed by a known method (such as sputtering or plasma CVD) using silicon oxide, silicon oxynitride, silicon nitride, and/or silicon nitride oxide. The insulating layer to be a base film functions as a blocking film for preventing impurities from entering a layer having a thin film transistor from the outside.

In this embodiment, a silicon nitride oxide layer with a thickness of 50 nm and a silicon oxynitride layer with a thickness of 100 nm are formed by CVD as the insulating layer 404 used as a base film.

Next, a thin film transistor 405 is formed over the insulating layer 404. The thin film transistor shown in Embodiment Mode 1 can be appropriately used as the thin film transistor 405. Here, as shown in FIG. 16A, a top gate thin film transistor including a semiconductor layer and an insulating layer serving as a gate insulating layer over the insulating layer 404, a gate electrode corresponding to the semiconductor layer over an insulating layer 1303, an insulating layer serving as a protective layer in a layer thereover, and a wiring connected to the semiconductor through the protective layer is formed.

Subsequently, an insulating layer 406 is formed from a single layer or stacked layers to cover the film transistor 405. Here, as the insulating layer, a siloxane polymer is applied to a thickness of 1.5 μm, then dried and baked to form the insulating layer 406. Then, a protective layer such as a layer containing carbon of DLC (diamond-like carbon) or the like, a layer containing silicon nitride, or a layer containing silicon oxynitride may be formed over the insulating layer 406.

Next, a contact hole is formed in the insulating layer 406 covering the thin film transistor and a connection terminal 407 is formed.

Note that, here, a layer 408 having a thin film transistor includes the insulating layer 404, the thin film transistor 405, the insulating layer 406, and the connection terminal 407.

Figure 19C:
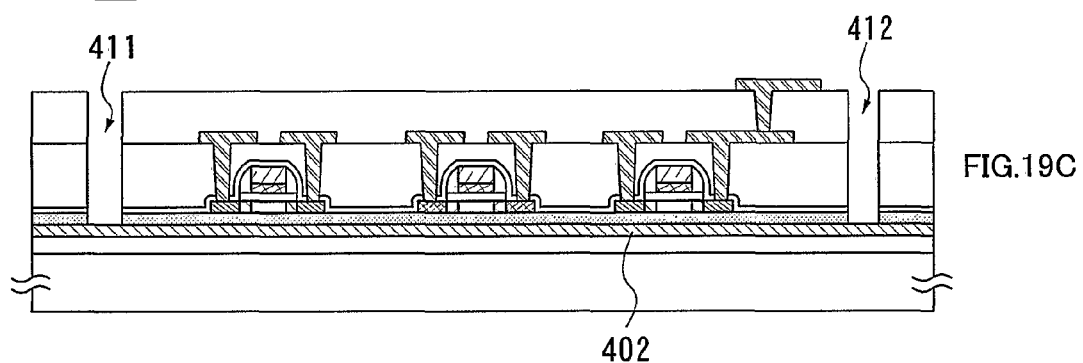

Then, as shown in FIG. 19C, openings 411 and 412 are formed to expose the separation layer 403. The openings 411 and 412 are formed by laser ablation or photolithography to penetrate the insulating layer 406 to the insulating layer 404.

Here, the openings 411 and 412 are formed by irradiation with laser beams emitted from a UV laser. Further, the openings are preferably formed continuously for each chip so that a layers having a thin film transistors of each wireless chip is divided by the openings 411 and 412.

Figure 19D:
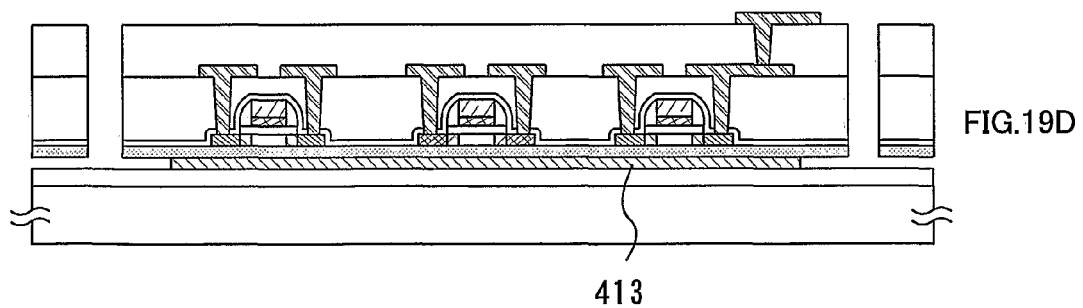

Subsequently, an etching agent is introduced into the openings 411 and 412, thereby removing a part of the separation layer 403 as shown in FIG. 19D. The separation layer that is partially etched is denoted by a separation layer 413. In the case of wet etching, a mixed solution obtained by diluted hydrofluoric acid with water or ammonium fluoride, a mixed solution of hydrofluoric acid and nitric acid, a mixed solution of hydrofluoric acid, a mixed solution of nitric acid and acetic acid, a mixed solution of hydrogen peroxide and sulfuric acid, a mixed solution of hydrogen peroxide, and ammonia water, a mixed solution of hydrogen peroxide and hydrochloric, or the like is used as the etching agent. Alternatively, in the case of dry etching, a gas containing halogen (such as fluorine)-based atoms or molecules or a gas containing oxygen is used. A gas or a solution containing halogen fluoride or a halogen compound is preferably used as the etching agent.

In this embodiment, a part of the separation layers is etched using chlorine trifluoride ($ClF_3$).

Next, as shown in FIG. 19D, in the layer 408 having a thin film transistor, a base 415 is attached to the surfaces of the insulating layer 406 and the connection terminal 407 using an adhesive 414.

Figure 19E:
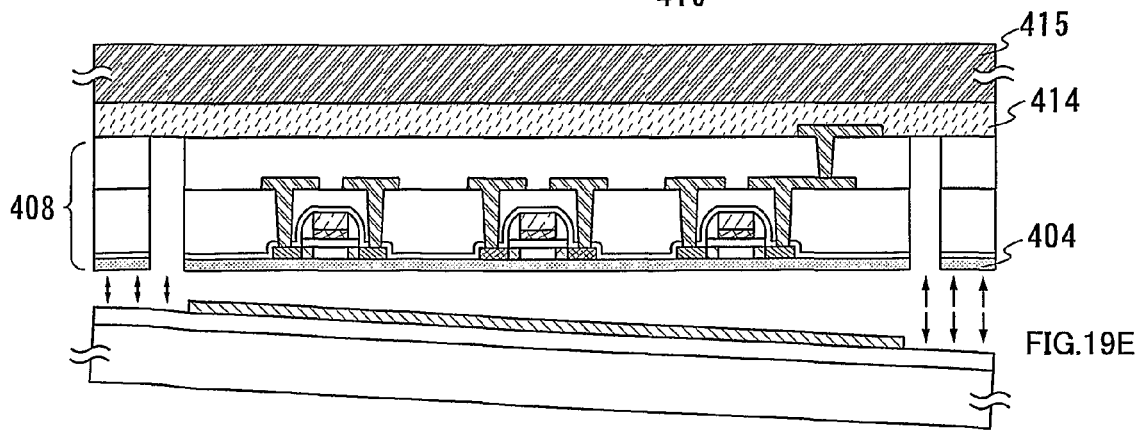

Then, as shown in FIG. 19E, the substrate 401, the insulating layer 402, and the release layer 413 are separated from the layer 408 having a thin film transistor.

A substrate which is more rigid than the substrate 401 is preferably used as the base 415. Here, a quartz substrate is used for the base 415. A peelable adhesive typified by a UV peelable adhesive which can be removed by UV irradiation, a heat peelable adhesive which can be removed by heat, a water-soluble adhesive, two-sided adhesive tape, or the like can be used as the adhesive 414.

Here, the adhesive strength between the base 415 and a layer 408 having a thin film transistor is set higher than that between the substrate 401 and the insulating layer 404. Then, only the layer 408 having a thin film transistor, which is provided over the insulating layer 404, is separated from the substrate.

Figure 20A:
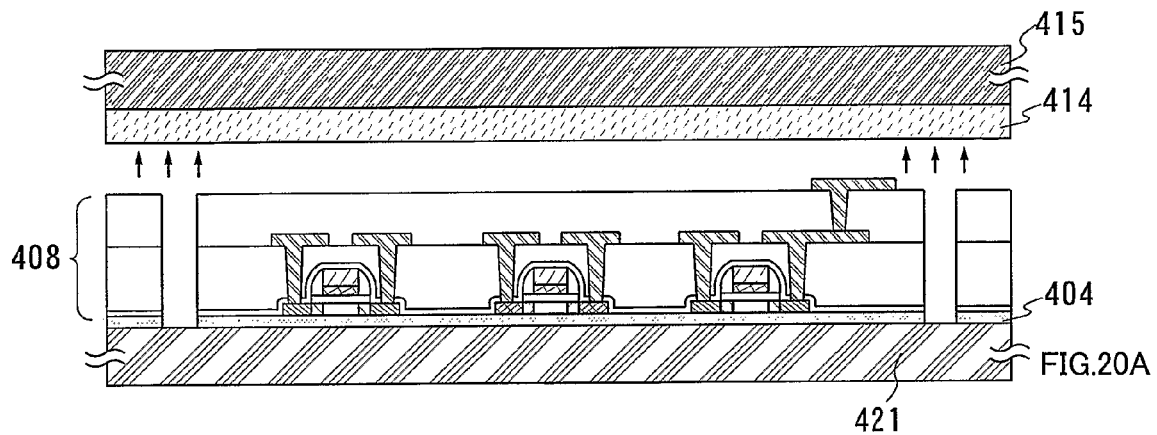
FIGS. 20A to 20C are cross-sectional views showing manufacturing steps of a wireless chip according to the present invention.

Next, as shown in FIG. 20A, the insulating layer 404 of the layer 408 having a thin film transistor is fixed to a flexible substrate 421 using an adhesive. Note that, in the case where an adhesive layer is provided on the flexible substrate 421, flexible substrate 421 can be fixed to the insulating layer 404 of the layer 408 having a thin film transistor without using the adhesive. Here, a sheet material in which a PET film containing silicone resin layer and silica coat are stacked can be used as the flexible substrate 421.

Next, the base 415 and the adhesive 414 is removed from the surfaces of the insulating layer 406 and the connection terminal 407 of the layer 408 having a thin film transistor.

Here, the adhesive 414 is irradiated with UV radiation to remove the adhesive 414.

Figure 20B:
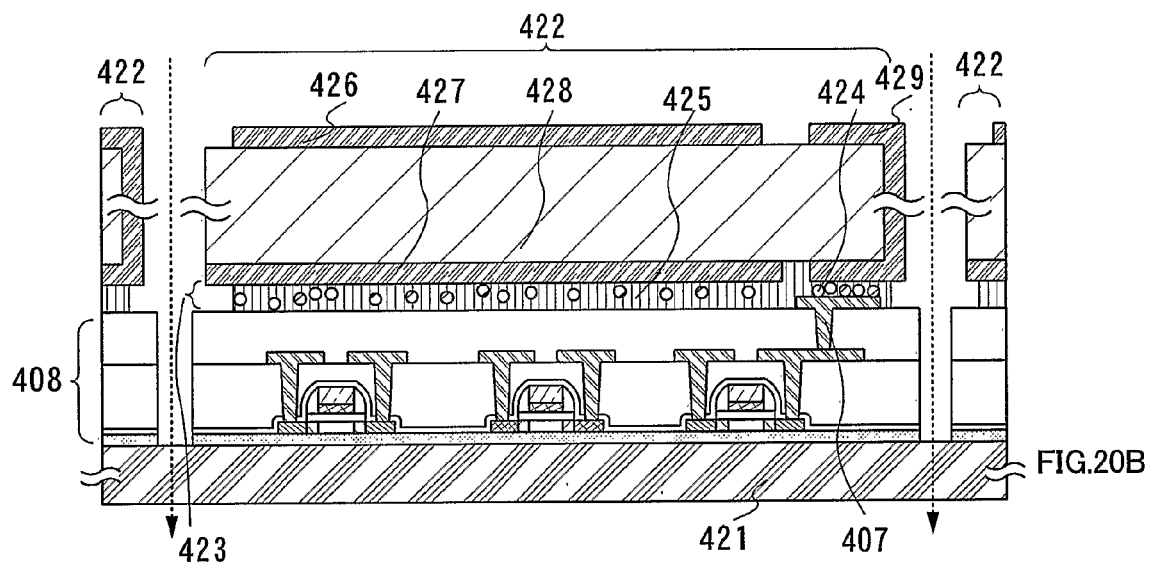

Next, as shown in FIG. 20B, a patch antenna 422 is attached to a surface of the layer 408 having a thin film transistor, specifically, the surfaces of the insulating layer 406 and the connection terminal 407 using an anisotropic conductive adhesive 423. The patch antenna 422 here includes a first conductive layer 426 serving as a radiating electrode, a second conductive layer 427 serving as a ground contact body, a dielectric layer 428 sandwiched between the first conductive layer 426 and the second conductive layer 427, and a power feeding layer 429. Further, the anisotropic conductive adhesive 423 is formed of an adhesive epoxy resin in which silver particles are dispersed as conductive particles 424.

Moreover, the power feeding layer 429 of the connection terminal 407 and the patch antenna 422 is connected to the second conductive layer 427 serving as a connection terminal and a ground contact body, which is not shown, using conductive particles 424 of the anisotropic conductive adhesive 423.

Thereafter, the flexible substrate 421 and the layer 408 having a thin film transistor are cut to have the same shape as respective antennas. In FIG. 20B, the cut portion is shown by a broken line arrow. Here, wireless chips are cut out by laser scribing.

Figure 20C:
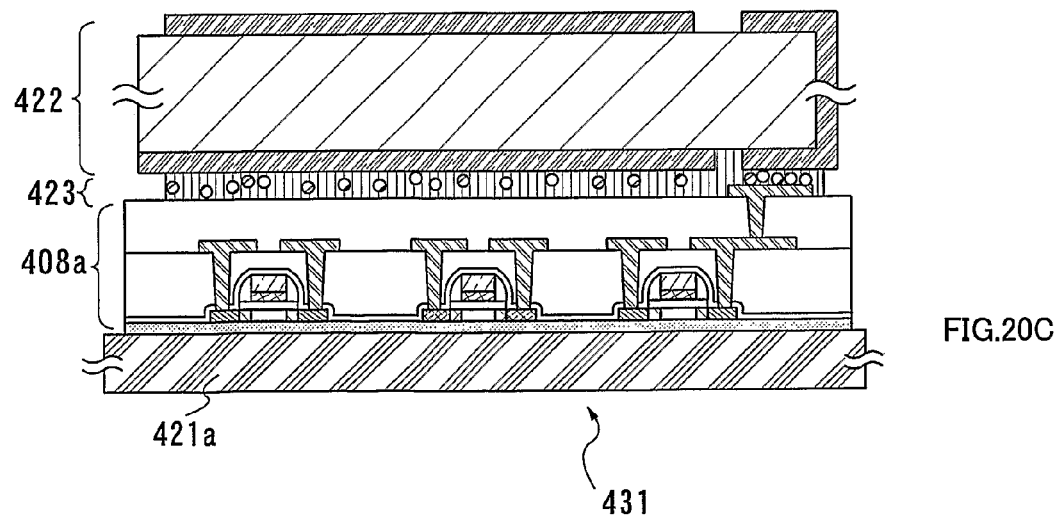

Through the above steps, as shown in FIG. 20C, it is possible to form a wireless chip 431 including a layer 408a having a thin film transistor fixed to a flexible substrate 421a, a patch antenna 422, the anisotropic conductive adhesive 423 which fixes the layer 408a having a thin film transistor to the patch antenna 422. Note that, in FIG. 20B, the layer 408 having a cut thin film transistor is shown as the layer 408a having a thin film transistor, and the cut flexible substrate 421 is shown as the flexible substrate 421a.

This embodiment can be freely combined with any one of the above embodiment modes.

Embodiment 2

In this embodiment will explain a method of manufacturing a wireless chip in which a layer having a thin film transistor is sandwiched between a plurality of patch antennas with reference to FIGS. 21A to 21D and FIGS. 22A to 22C.

Figure 21A:
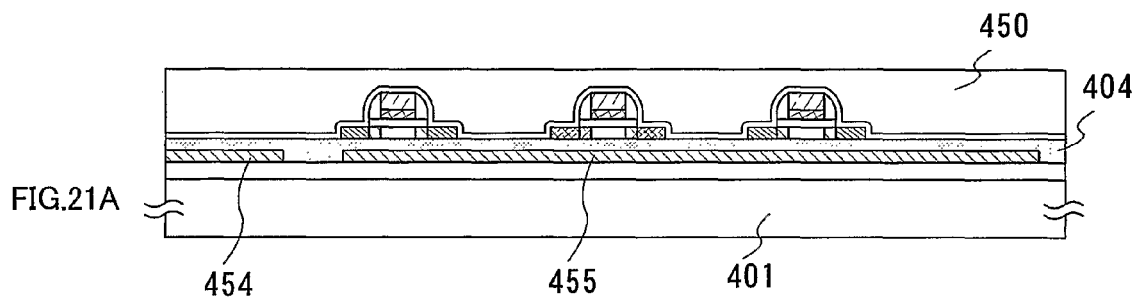
FIGS. 21A to 21D are cross-sectional views showing manufacturing steps of a wireless chip according to the present invention.

As in Embodiment 1, an insulating layer 402, release layers 454 and 455 are formed over a surface of a substrate 401 as shown in FIG. 21A. Here, the release layers 454 and 455 are formed by forming a thin film over a surface of the substrate 401 and thereafter selectively etching the thin film using a resist mask formed by photolithography. Here, after a tungsten film is formed by sputtering, the release layers are formed except an area where a first connection terminal exposed to an insulating layer 404 side is formed.

Next, the insulating layer 404 serving as a base is formed over the insulating layer 402 and the release layers 454 and 455.

Then, a thin film transistor is formed over the insulating layer 404 as in Embodiment 1. Here, a semiconductor layer and an insulating layer serving as a gate insulating layer are formed over the insulating layer 404, a gate electrode corresponding to the semiconductor layer is formed over the insulating layer, and an insulating layer 450 is formed in a layer thereover. Thereafter, a protective layer such as a layer containing carbon of DLC (diamond-like carbon) or the like, a layer containing silicon nitride, or a layer containing silicon oxynitride may be formed over the insulating layer 450.

Figure 21B:
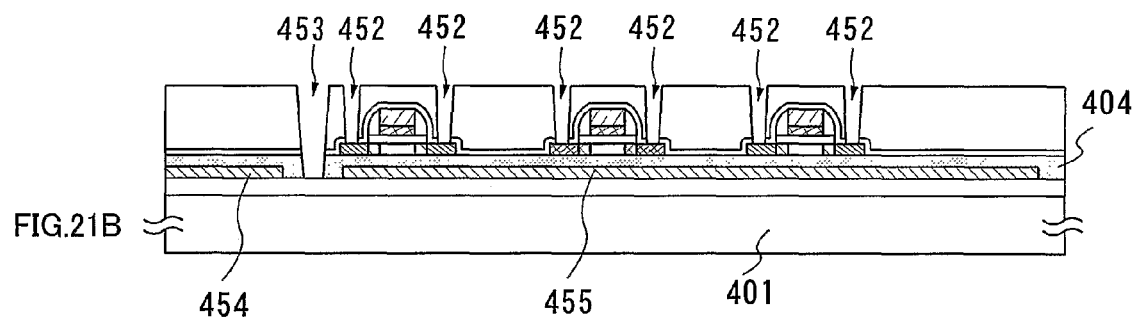

Next, as shown in FIG. 21B, a first contact hole 452 is formed over the insulating layer 450. In the first contact hole 452, a source region and a drain region of the semiconductor layer are exposed. Then, a second contact hole 453 is formed. The second contact hole is formed by etching the insulating layers of the insulating layer 450 to the insulating layer 404, thereby exposing the insulating layer 402. Note that, the second contact hole 453 preferably provided in an area where the release layers 454 and 455 are not formed.

Figure 21C:
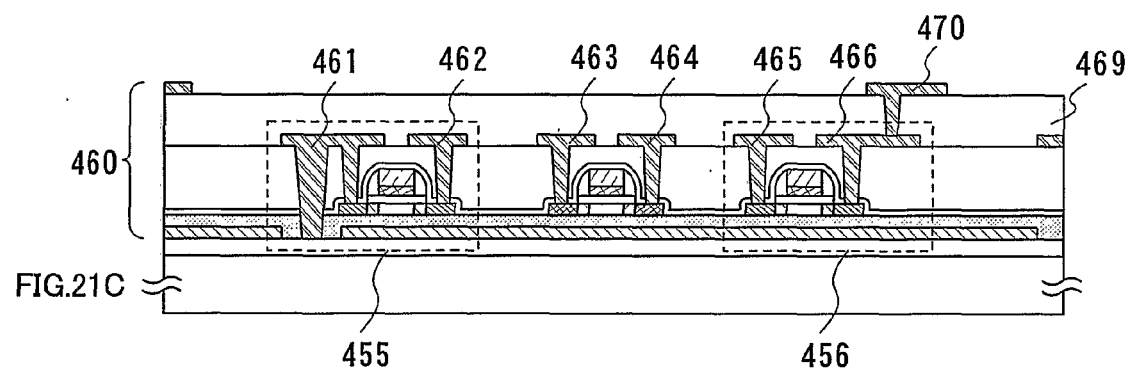

Thereafter, as shown in FIG. 21C, conductive layers 461 to 466 serving as wirings are formed in the first contact hole and the second contact hole. Note that, the conductive layer serving as a wiring also serves as a connection terminal.

Next, an insulating layer 469 is formed over the insulating layer 450 and the conductive layers 461 to 466 serving as wirings, a contact hole is formed in the insulating layer 469, and an connection terminal 470 is formed.

Here, a first thin film transistor 455 includes a semiconductor layer, a gate insulating layer, a gate electrode, conductive layers 461 and 462 connected to a source region and a drain region of the semiconductor layer. Meanwhile, a second thin film transistor 456 includes a semiconductor layer, a gate insulating layer, a gate electrode, wirings 465 and 466 connected to the source and drain regions of the semiconductor layer. Further, the wiring 466 of the second thin film transistor 456 is connected to the connection terminal 470.

Here, a layer 460 having a thin film transistor includes the insulating layer 404, the first thin film transistor 455, the conductive layer 461 connected to the first thin film transistor 455, the second thin film transistor 456, the insulating layer 469, and the connection terminal 470.

Figure 21D:
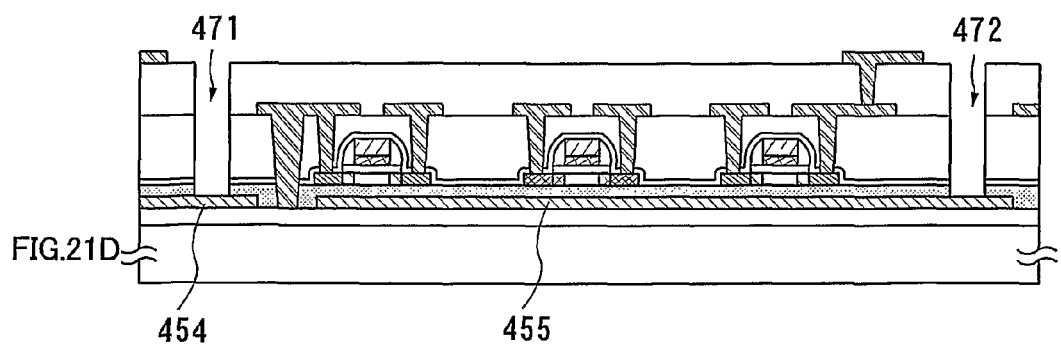

Then, as shown in FIG. 21D, openings 471 and 472 are formed to expose the separation layers 454 and 455 as in Embodiment 1. The openings 471 and 472 are formed by laser ablation or photolithography to penetrate the insulating layer 469 to the insulating layer 404. Further, the openings (grooves) are preferably formed continuously for each wireless chip so that a thin film transistor of each wireless chip is formed using the openings 471 and 472.

Figure 22A:
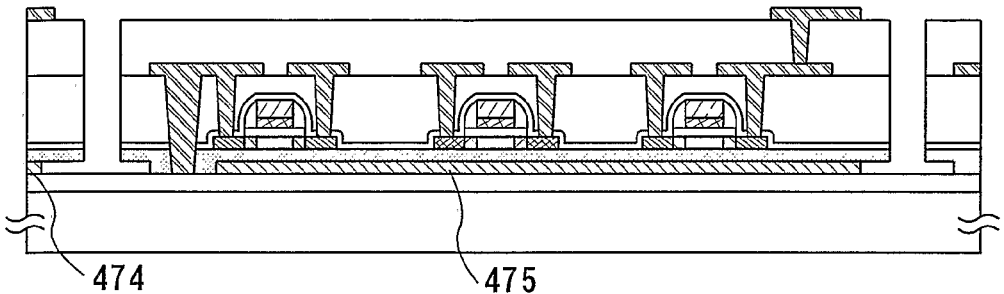
FIGS. 22A to 22C are cross-sectional views showing manufacturing steps of a wireless chip according to the present invention.

Subsequently, as in Embodiment 1, an etching agent is introduced into the openings 471 and 472, thereby removing a part of the separation layers 454 and 455 as shown in FIG. 22A. The separation layers that are partially etched are denoted by separation layers 454 and 455.

Figure 22B:
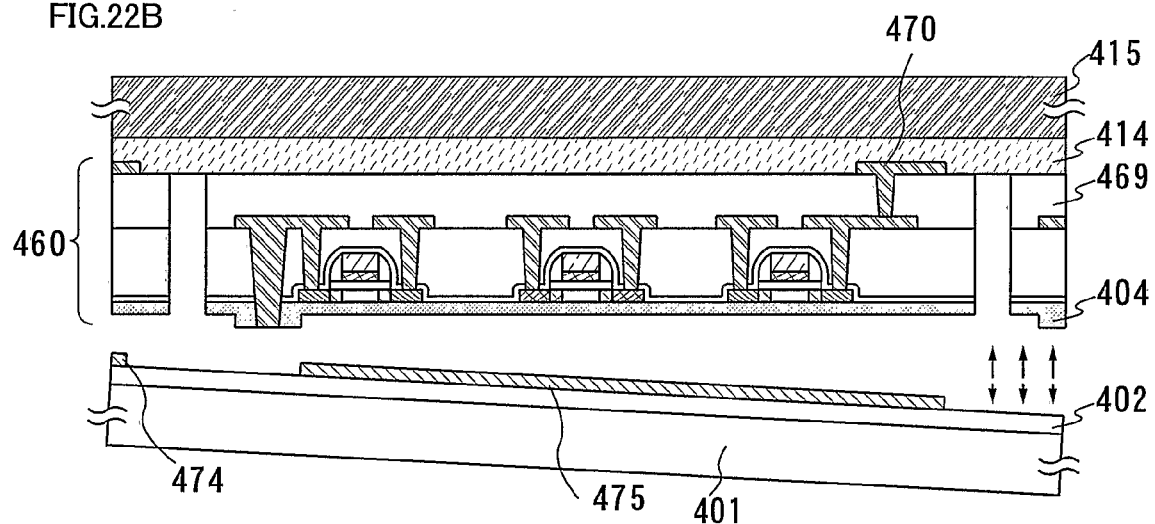

Next, as shown in FIG. 22B, in the layer 460 having a thin film transistor, a base 415 is attached to the surfaces of the insulating layer 469 and the connection terminal 470 using an adhesive 414.

Then, as shown in FIG. 19E, the substrate 401, the insulating layer 402, and the release layers 474 and 475 are separated from the layer 460 having a thin film transistor.

Figure 22C:
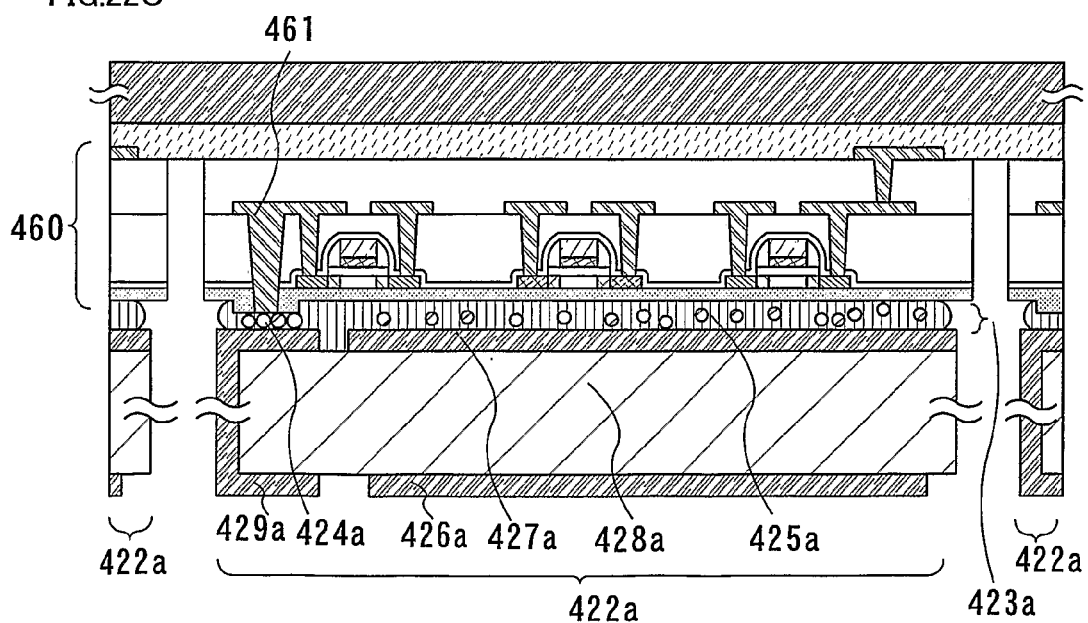

Next, as shown in FIG. 22C, a first patch antenna 422a is attached to a first surface of the layer 460 having a thin film transistor, specifically, the surfaces of the insulating layer 404 and the conductive layer 461 using a first anisotropic conductive adhesive 423a. The first patch antenna 422a includes, as with the antenna 422 in Embodiment 1, a first conductive layer 426a serving as a radiating electrode, a second conductive layer 427a serving as a ground contact body, a dielectric layer 428a sandwiched by the first conductive layer 426a and the second conductive layer 427a, and a power feeding layer 429a. Further, the anisotropic conductive adhesive 423a is formed of an adhesive epoxy resin 425a in which silver particles are dispersed as conductive particles 424a.

Moreover, the power feeding layer 429a of the first connection terminal 464 and the patch antenna 422a is connected to the second conductive layer 427a serving as a connection terminal and a ground contact body, which is not shown, using conductive particles 424a of the anisotropic conductive adhesive 423a.

Figure 23A:
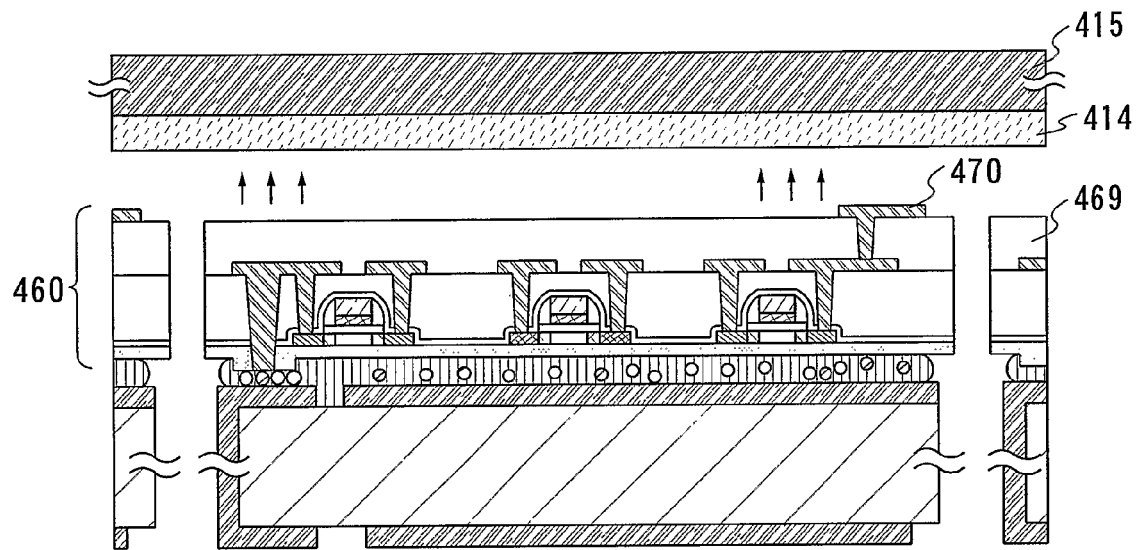
FIGS. 23A and 23B are cross-sectional views showing manufacturing steps of a wireless chip according to the present invention.

Next, as shown in FIG. 23A, the base 415 and the adhesive 414 is removed from the surfaces of the insulating layer 469 and the connection terminal 470 of the layer 460 having a thin film transistor as in Embodiment 1.

Figure 23B:
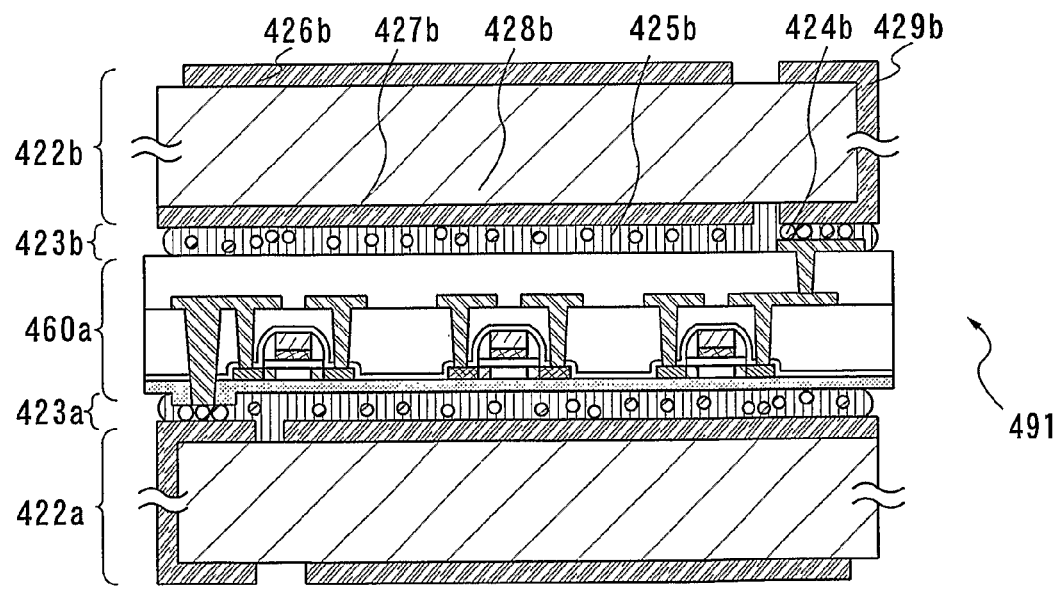

Next, as shown in FIG. 23B, a second patch antenna 422b is attached to a second surface of the layer 460 having a thin film transistor, specifically, the surfaces of the insulating layer 469 and the connection terminal 470 using a second anisotropic conductive adhesive 423b. The second patch antenna 422b includes, as with the first patch antenna 422a, a third conductive layer 426b serving as a radiating electrode, a fourth conductive layer 427b serving as a ground contact body, a dielectric layer 428b sandwiched between the third conductive layer 426b and the fourth conductive layer 427b, and a power feeding layer 429b. Further, the anisotropic conductive adhesive 423b is formed of an adhesive epoxy resin in which silver particles that are conductive particles 424b are dispersed.

Moreover, the power feeding layer 429b of the connection terminal 470 and the second patch antenna 422b is connected to the fourth conductive layer 427b serving as a connection terminal and a ground contact body, which is not shown, using conductive particles 424b of the anisotropic conductive adhesive 423b.

Through the above steps, it is possible to form a wireless chip 491, shown in FIG. 23B, including the first patch antenna 422a and the second patch antenna 422b, a layer 460a having a thin film transistor, the first anisotropic conductive adhesive 423a which fixes the first patch antenna 422a to the first surface of the layer 408a having a thin film transistor, and the second anisotropic conductive adhesive 423b which fixes the second patch antenna 422b to the second surface of the layer 460 having a thin film transistor. Note that, in FIG. 23B, the layer 460 having a cut thin film transistor is shown as the layer 460a having a thin film transistor.

Embodiment 3

Wireless chips of the present invention can be applied to a wide range. For example, a wireless chip 20 can be provided on products such as vehicles (a bicycle 3901 (FIG. 11B), automobiles, and the like), foods, plants, cloths, commodities (a bag 3900 (FIG. 11A) and the like), electronic devices, inspection devices, and the like. Further, it can be provided on animals and human bodies. The electronic devices include a liquid crystal display device, an EL (ElectroLuminescence) display device, a television device (also referred to as a TV simply, a TV receiver, or a television receiver), a cellular phone 3902 (FIG. 11C), a printer, a camera, a personal computer, a goggle 3903 with earphones (FIG. 11D), a speaker device 3904 (FIG. 11E), headphones 3905 (FIG. 11F), a navigation device, an ETC (Electronic Toll Collection system: automatic toll collection system for toll roads) car-mounted device, an electronic key, and the like.

By providing the wireless chip 20 of the present invention to the bag 3900, the bicycle 3901, and the like, it is possible to detect whereabouts of them using GPS. Consequently, it is possible to find stolen bicycles. Further, searching for missing people becomes easy.

Further, by providing the wireless chip 20 in the cellular phone 3902, transmission and reception of information and telephone become possible.

Moreover, by providing the wireless chip of the present invention on the goggle with earphones 3903, the speaker device 3904, or the headphone 3905, it is possible to enjoy music played by an audio device without using a cord for the connection to the audio device. Moreover, a compact hard disk (memory device) may be provided together with the wireless chip 20 in the goggle with earphones 3903. Further, in the case where the wireless chip 20 has a central processing unit, an audio signal encoded in the audio device can be received, decoded, and amplified by the goggle with earphones 3903, the headphones 3905, or the speaker device 3904. Therefore, the sound can be heard with high confidentiality. Moreover, since a cord is not necessary, the goggle with earphones 3903 and the headphones 3905 can be worn easily, and the speaker device 3904 can be mounted easily. In this case, it is preferable that the goggle with earphones, the headphones, and the speaker device be provided with batteries.

The wireless chip of the present invention is fixed to a product by mounting the wireless chip onto a printed substrate, pasting it to a surface thereof, or embedding it. For example, in the case of using a package containing an organic resin, the wireless chip is fixed to the product by embedding the wireless chip into the organic resin. When the wireless chip of the present invention is provided on products such as foods, plants, animals, human bodies, cloths, commodities, electronic devices, systems such as a product inspection system or an inspection system can be made efficient.

Figure 13:
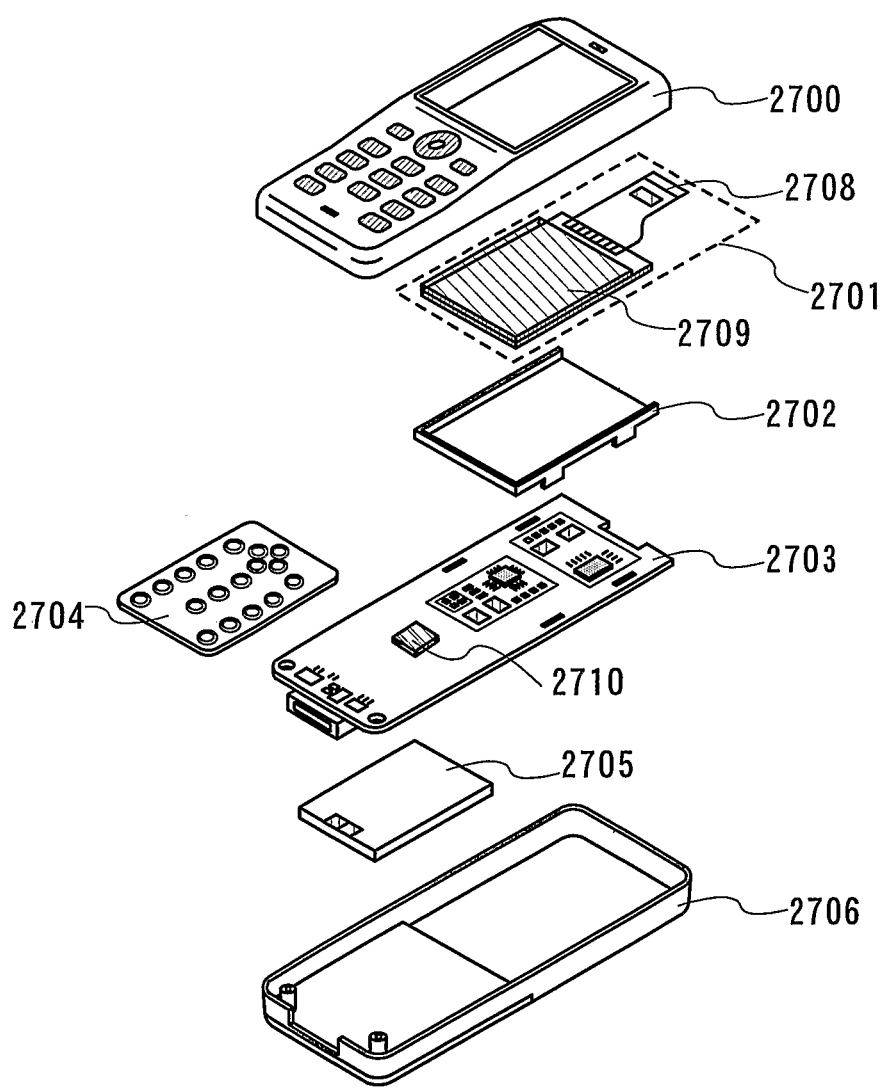
FIG. 13 is a development view showing an application example of a wireless chip of the present invention.

Next, a mode of an electronic device on which a wireless chip of the present invention has been mounted will be described with reference to the drawings. The electronic device to be exemplified here is a cellular phone, including cases 2700 and 2706, a panel 2701, a housing 2702, a printed wiring substrate 2703, and an operation button 2704, a battery 2705 (FIG. 13). The panel 2701 is removably incorporated in the housing 2702 and the housing 2702 is fit into the printed wiring substrate 2703. The shape and size of the housing 2702 are changed appropriately in accordance with the electronic device into which the panel 2701 is to be incorporated. On the printed wiring substrate 2703, a plurality of packaged semiconductor devices and a wireless chip 2710 of the present invention are mounted.

The panel 2701 is connected to the printed wiring substrate 2703 through a connection film 2708. The above panel 2701, housing 2702, and the printed wiring substrate 2703 are housed inside the cases 2700 and 2706 together with the operation button 2704 and the battery 2705. A pixel region 2709 in the panel 2701 is provided so as to be observed through an opening window provided on the case 2700.

It is to be noted that the shapes of the cases 2700 and 2706 shown are just an example of an exterior shape of the cellular phone, and the electronic device of the present invention can be modified into various modes in accordance with the functions and intended purposes.

Figure 14:
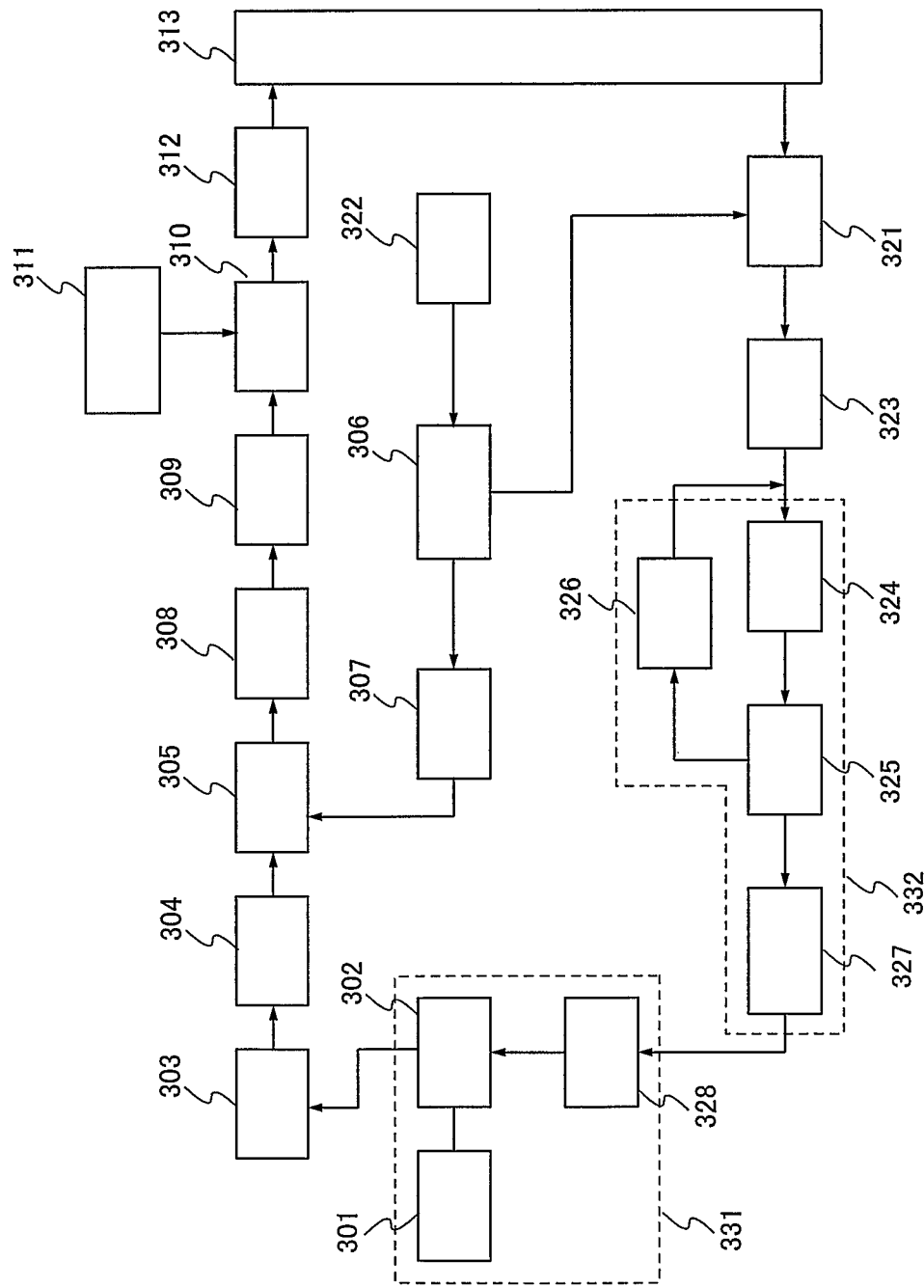
FIG. 14 shows a high-frequency circuit applicable to the present invention.

Here, a block diagram of a high-frequency circuit typified by a data modulation/demodulation circuit of a cellular phone will be described with reference to FIG. 14.

First, a step of sending a signal, which has been received with an antenna, to a base band unit will be described. The received signal inputted into an antenna 301 is inputted into a low noise amplifier (LNA) 303 from a duplexer 302 and amplified to be a predetermined signal. The received signal inputted into the low noise amplifier (LNA) 303 is inputted into a mixer 305 through a band pass filter (BPF) 304. Into this mixer 305, an RF signal from a hybrid circuit 306 is inputted, and an RF signal component is eliminated in a band pass filter 307 and demodulated. The received signal outputted from the mixer 305 is inputted into a mixer 310 after being amplified by an amplifier 309 through a SAW filter 308. Into the mixer 310, a local oscillation signal of a predetermined frequency is inputted from a local oscillator circuit 311 and converted to a desired frequency, and amplified into a predetermined level in an amplifier 312. Then, the signal is sent to a base band unit 313. The antenna 301, the duplexer 302, and a low pass filter 328 are shown as an antenna front end module 331.

Next, a step of oscillating a signal sent from a base band unit using an antenna will be described. The transmission signal sent from the base band unit 313 is mixed with the RF signal from the hybrid circuit 306 by a mixer 321. This hybrid circuit 306 is connected to a voltage control oscillator circuit (VCO) 322, thereby supplying an RF signal of a predetermined frequency.

The transmission signal which has been RF-modulated by the mixer 321 is amplified by a power amplifier (PA) 324 through a band pass filter (BPF) 323. A part of the output from the power amplifier (PA) 324 is taken out from a coupler 325 and adjusted to a predetermined level by an attenuator (APC) 326. Then, the output is inputted into the power amplifier (PA) 324 again and adjusted so that a transmission gain of the power amplifier (PA) 324 becomes constant. The transmission signal sent from the coupler 325 is inputted into the duplexer 302 through an isolator 327 for backflow prevention and a low pass filter (LPF) 328, and sent from the antenna 301 connected to the duplexer 302. The attenuator (APC) 326, the power amplifier (PA) 324, the coupler 325, and the isolator 327 are shown as an isolator power amplifier module 332.

Since the wireless chip of the present invention has the above high frequency circuit, the number of parts can be reduced. Thus, the number of mount parts on the wiring substrate can be decreased, so that the area of the wiring substrate can be reduced. As a result, a cellular phone can be reduced in size.

Figure 12A:
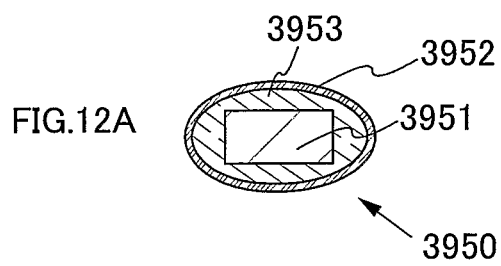
FIGS. 12A to 12D each show an application example of a wireless chip of the present invention.

Next, an example of an inspection device which can wirelessly send detected functional data of a biological body will be described with reference to FIGS. 12A to 12D. An inspection device 3950 shown in FIG. 12A is provided with a wireless chip 3951 of the present invention inside a capsule 3952 which is coated with a protective layer. A space between the capsule 3952 and the wireless chip 3951 may be filled with a filler 3953.

Figure 12B:
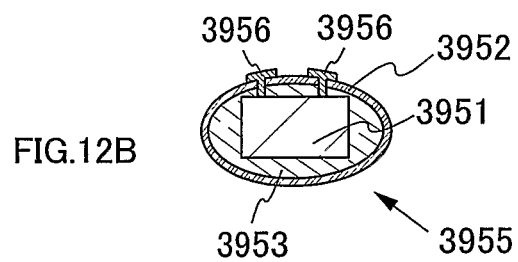

In an inspection device 3955 shown in FIG. 12B, the wireless chip 3951 of the present invention is provided inside the capsule 3952 which is coated with a protective layer. An electrode 3956 of the wireless chip is exposed at the outside of the capsule 3952. A space between the capsule 3952 and the wireless chip 3951 may be filled with the filler 3952.

The wireless chip 3951 in the inspection devices 3950 and 3955 is a wireless chip having a detection portion shown in FIG. 9C. The physical amount or the chemical amount is measured in the detection portion to detect functional data of a biological body. The detected result can be converted into signals and sent to a reader/writer. In the case of detecting the physical amount such as the amount of pressure, light, or acoustic wave, the inspection device 3950 in which the electrode is not exposed at the outside of the capsule 3952 as shown in FIG. 12A can be used.

The protective layer provided on the surface of the capsule preferably contains diamond-like carbon (DLC), silicon nitride, silicon oxide, silicon oxynitride, or carbon nitride. The capsule and the filler may be known ones selected appropriately. By providing the protective layer on the capsule, it is possible to prevent the capsule and the wireless chip from melting or being denatured inside the body.

Moreover, in the case of detecting temperature, flow rate, magnetism, acceleration, humidity, a chemical substance such as a gas component or a liquid component such as ions, and the like, the inspection device 3950 in which the electrode 3956 is exposed at the outside of the capsule 3952 as shown in FIG. 12B is preferably used.

In the case of imaging the inside of a body with the use of the inspection device, the inspection device may be provided with a light-emitting device using an LED or an EL device. This makes it possible to take an image of the inside of a body.

In order to send an inspection result from the inspection device to the reader/writer by itself, the inspection device may be provided with a known battery.

Figure 12C:
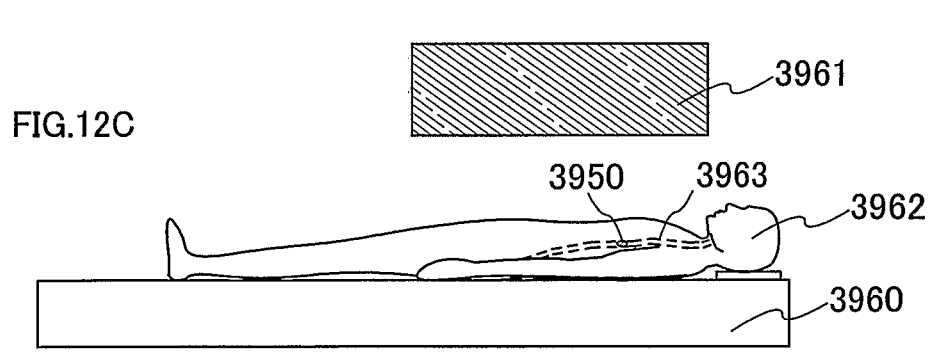

Next, a method of using the inspection device will be described. As shown in FIG. 12C, an examinee 3962 swallows the inspection device 3950 or 3955 and let the inspection device 3950 or 3955 move inside a body lumen 3963. A result detected by the detection portion in the wireless chip is sent to the reader/writer 3961 provided near the examinee. This result is received with the reader/writer. Consequently, it is possible to detect functional data of the biological body of the examinee on the spot without collecting the wireless chip. Moreover, images of the body lumen and digestive organs can be taken.

Figure 12D:
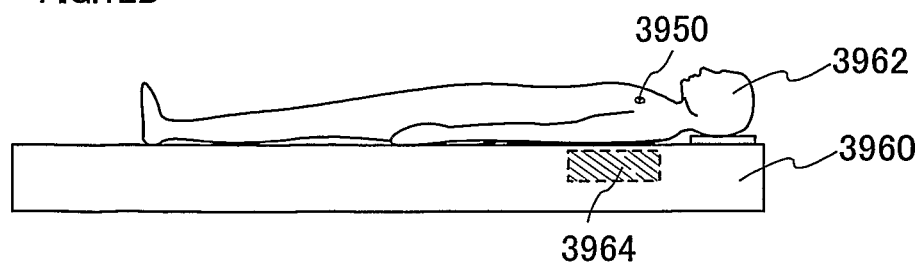

Further, as shown in FIG. 12D, the result detected by the detection portion in the wireless chip is sent to the reader/writer 3964 provided near the examinee by embedding the inspection device 3950 or 3955 inside the body of the examinee 3962. In this case, the inspection device 3955 is embedded in the body so that the electrode 3956 is in contact with a portion of the examinee's body to be measured. The reader/writer receives the result. The received result is recorded in a biological information management computer and processed therein, so that the biological information of the examinee can be managed. By providing the reader/writer 3964 in a bed 3960, it is possible to detect, in any time, biological information of examinees who suffer from dysfunction and hardly moves around and to manage disease state or health conditions of the examinees.

This embodiment can be appropriately combined with any one of the above Embodiment Modes.

Embodiment 4

Figure 15A:
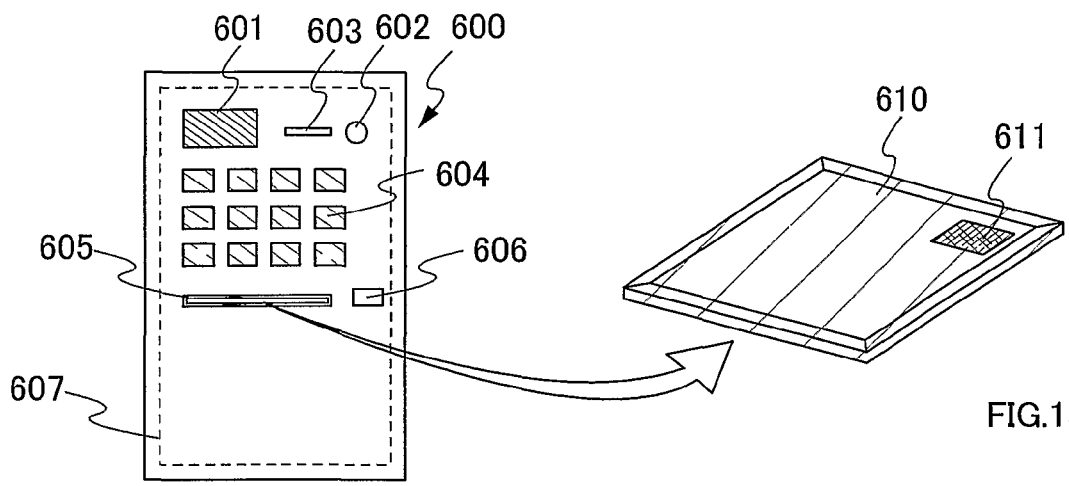
FIGS. 15A to 15C each show an application example of a wireless chip of the present invention.
Figure 15B:
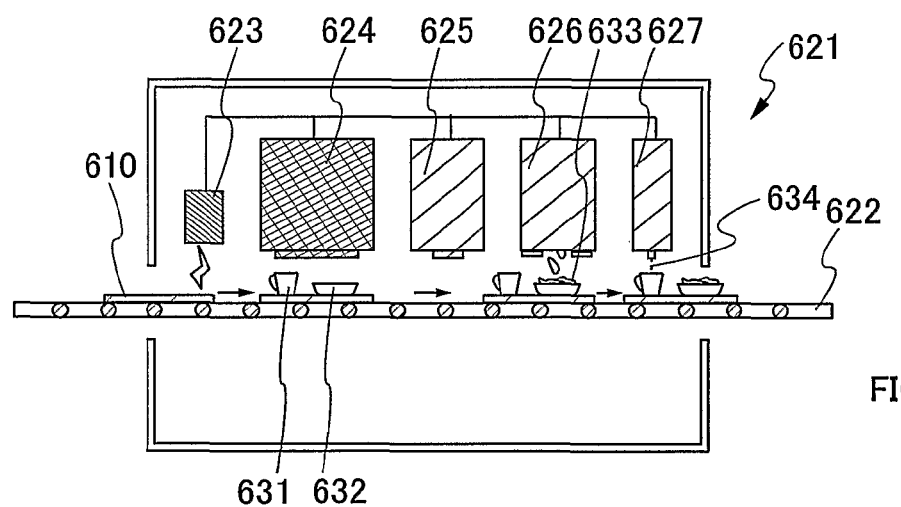
Figure 15C:
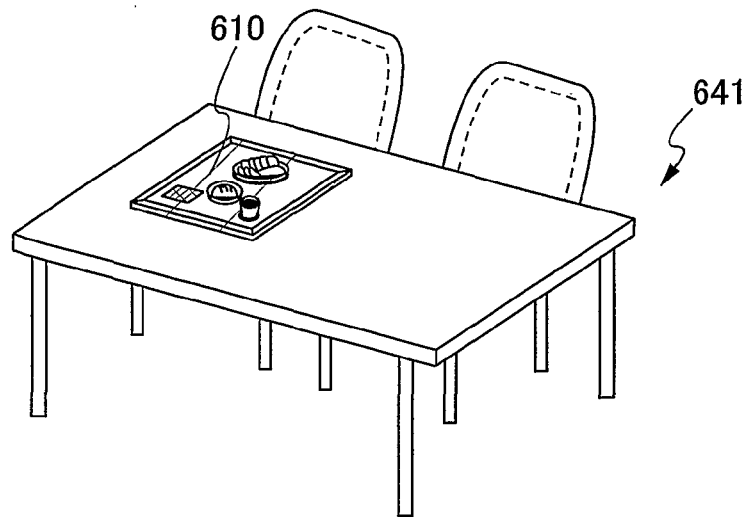

This embodiment will describe a system by which the number of workers in a store is reduced and the labor costs can be reduced, typically, a system of an eating place (such as a restaurant, cafeteria, or fast-food place) in which eatables and drinkables can be automatically supplied to purchasers with reference to FIGS. 15A to 15C.

A restaurant where eatables and drinkables can be automatically supplied to purchasers has a vending machine 600 shown FIG. 15A. The vending machine 600 is provided with a display area 601, a money slot (typified by a coin slot 602 and a bill slot 603), a selection button 604 of a menu, a tray supplier 605, a money return slot 606, or the like. Further, a door body is provided on the front face of the vending machine 600, and a tray storage 607 is provided behind the door body. A tray stored in the tray storage 607 is provided with a wireless chip having a write-once memory. Further, vending machine 600 is provided with a reader/writer for writing order information of each purchaser into the wireless chip.

A purchaser throw money into the coin slot of the vending machine 600. Next, the amount injected is displayed on the display area 601 of the vending machine 600, and selection button 604 available depending on the amount injected is lit at the same time. The purchaser push the selection button 604 of the menu to be purchased. Thus, information of the selected menu is stored in a memory of a wireless chip by the reader/writer inside the vending machine 600. After that the purchaser receives a tray 610 provided with a wireless chip storing the information of the menu to be purchased, from the tray supplier 605.

Next, the purchaser put the tray 610 on a transportation machine such as a belt conveyer, which is provided on a machine capable of automatically supplying eatables and drinkables (hereinafter referred to as an automatic refreshment supply device 621) (FIG. 15B). The automatic refreshment supply device 621 includes a reader/writer 623, a dish supplier 624, a refreshment suppliers 625 to 627, and the like. The tray 610 put on a transportation machine 622 is conveyed into the automatic refreshment supply device 621, and the information of the menu to be purchased, which has been stored in the wireless chip 611 provided on the tray is read with the reader/writer 623. The reader/writer 623 sends information of dishes or refreshments associated with the menu to the refreshment suppliers 625 to 627. When the fact that the tray 610 is carried to the vicinity of the dish supplier is detected by a sensor or a switch provided near the transportation machine 622, the dish supplier 624 supplies suitable dishes 631 and 632 to the tray 610. Similarly, when the fact that tray 610 is carried to the vicinity of the refreshment suppliers 625 to 627 is detected, the refreshment suppliers 625 to 627 supply appropriate refreshments 633 and 634. Through the above steps, the refreshments selected by the purchaser can be automatically supplied to the tray 610.

Thereafter, the purchaser can receive the tray 610 supplying refreshments from the transportation machine 622, thereby eat and drink the refreshments on a table 641 (FIG. 15C).

Any one of Embodiment modes 1 to 6, Embodiments 1 to 3 can be used for the wireless chip of this embodiment.

Note that a system which transmits information read by a reader/writer to an administrative center of the manufacturer may be provided through an interface. The interface is a information transmission/reception device on the terminal side for transmitting the information stored in the wireless chip to the outside. The Internet, telephone lines, or the like can be used as the interface. Information read by the reader/writer and transmitted to the administrative center of a manufacturer includes the number of dishes supplied by the dish supplier, the supplied amount of refreshments in the refreshment supply device, an expiration date, or the like. Consequently, the manufacturer can grasp the amount of refreshments consumed in the eating place. Thus, the shipment of dishes and refreshments can be managed automatically, the process of ordering in eating places and the manufacturer can be simplified, and the delay of ordering due to reduction in workers can be prevented.

Using the above system, it is possible to reduce workers for handling money, serving refreshments, or the like; thus, the labor costs and other costs can be reduced. Further, it is possible to offer refreshments to a purchaser rapidly.

Explanation of Reference

11: power source circuit, 12: clock generating circuit, 13: data modulation/demodulation circuit, 14: control circuit, 15: interface circuit, 16: memory circuit, 17: bus, 18: antenna, 19: reader/writer, 20: wireless chip, 21: central processing unit, 30: detecting element, 31: detection element, 32: control circuit, 100: substrate, 101: organic resin layer, 102: layer, 103: antenna, 104: anisotropic conductive adhesive, 105: insulating layer, 106: thin film transistor, 107: connection terminal, 108: insulating layer, 109: conductive particles, 110: dielectric layer, 111: conductive layer, 112: conductive layer, 113: power feeding layer, 120: layer, 121: layer, 122: layer, 123: layer, 124: insulating layer, 125: insulating layer, 126: connection terminal, 127: insulating layer, 131: layer, 132: layer, 133: anisotropic conductive adhesive, 134: anisotropic conductive adhesive, 135: anisotropic conductive adhesive, 141: layer, 142: thin film transistor, 150: passive element, 151: passive element, 152: passive element, 154: insulating layer, 157: insulating layer, 160: connection terminal, 162: conductive layer, 165.: conductive layer, 168: connection terminal, 169: connection terminal, 171: conductive layer, 180: layer, 181: antenna, 182: interlayer insulating layer, 183: insulating layer, 184: connection terminal, 185: thin film transistor, 186: thin film transistor, 187: anisotropic conductive adhesive, 189: thin film transistor, 190: thin film transistor, 191: connection terminal, 192: insulating layer, 193: connection terminal, 194: layer, 195: thin film transistor, 196: conductive layer, 197: antenna, 198: insulating layer, 199: connection terminal, 201: dielectric layer, 202: conductive layer, 203: conductive layer, 204: power feeding point, 205: degradation molecule element, 211: dielectric layer, 212: conductive layer, 213: conductive layer, 214: power feeding point, 215: degeneration separation element, 221: dielectric layer, 222: conductive layer, 223: conductive layer, 224: power feeding layer, 225: degradation molecule element, 241: dielectric layer, 242: conductive layer, 243: conductive layer, 244: power feeding layer, 301: antenna, 302: duplexer, 303: low noise amplifier (LNA), 304: band pass filter (BPF), 305: mixer, 306: hybrid circuit, 307: band pass filter (BPF), 308: SAW filter, 309: amplifier, 310: mixer, 311: local oscillator circuit, 312: amplifier, 313: base band unit, 321: mixer, 322: voltage control oscillator circuit (VCO), 323: band pass filter (BPF), 324: power amplifier (PA), 325: coupler, 326: attenuator (APC), 327: isolator, 328: low pass filter, 331: antenna front-end module, 332: isolator power amplifier module, 400: substrate, 401: substrate, 402: insulating layer, 403: release layer, 404: insulating layer, 405: thin film transistor, 406: insulating layer, 407: connection terminal, 408: layer, 411: opening, 413: release layer, 414: adhesive, 415: base, 418: layer, 421: substrate, 422: patch antenna, 423: anisotropic conductive adhesive, 424: conductive particles, 426: conductive layer, 427: conductive layer, 428: dielectric layer, 429: power feeding layer, 431: wireless chip, 450: insulating layer, 452: contact hole, 453: contact hole, 454: release layer, 455: thin film transistor, 456: thin film transistor, 460: layer, 461: conductive layer, 464: connection terminal, 465: wiring, 466: wiring, 469: insulating layer, 470: connection terminal, 471: opening, 474: release layer, 491: wireless chip, 600: vending machine, 601: display area, 602: coin slot, 603: bill slot, 604: selection button, 605: tray supplier, 606: money return slot, 607: tray storage, 610: tray, 611: wireless chip, 621: automatic refreshment supply device, 622: transportation machine, 623: reader/writer, 624: dish supplier, 625: refreshment supplier, 631: dish, 633: refreshment, 641: table, 660: vending machine, 1003: analysis circuit, 1004: control signal generating circuit, 1005: ACON, 1006: RCON, 1007: TCON, 1008: ICON, 1009: ALU, 1010: resister, 1011: address controller, 103*a*: antenna, 103*b*: antenna, 113*a*: power feeding layer, 113*b*: power feeding layer, 1302: semiconductor layer, 1303: insulating layer, 1304: gate electrode, 1305: insulating layer, 1306: insulating layer, 1307: wiring, 1308: sidewall (side wall spacer), 1309: channel protective layer, 1310: low-concentration impurity band, 1401: substrate, 1402: gate electrode, 1403: insulating layer, 1404: semiconductor layer, 1405: wiring, 181*a*: square coil shape, 181*b*: square loop shape, 181*c*: linear dipole shape, 2700: chassis, 2701: panel, 2702: housing, 2703: printed wiring substrate, 2704: operation button, 2705: battery, 2708: connection film, 2709: pixel area, 2710: wireless chip, 3900: bag, 3901: bicycle, 3902: cellular phone, 3903: goggle with earphones, 3904: speaker device, 3905: headphones, 3950: inspection device, 3951: wireless chip, 3952: capsule, 3953: filler, 3955: inspection device, 3956: electrode, 3960: bed, 3961: reader/writer, 3962: examinee, 3963: body lumen, 3964: reader/writer, 408*a*: layer, 421*a*: substrate, 422*a*: patch antenna, 422*b*: patch antenna, 423*a*: anisotropic conductive adhesive, 423*b*: anisotropic conductive adhesive, 424*a*: conductive particles, 424*b*: conductive particles, 425*a*: epoxy resin, 426*a*: conductive layer, 426*b*: conductive layer, 427*a*: conductive layer, 427*b*: conductive layer, 428*a*: dielectric layer, 428*b*: dielectric layer, 429*a*: power feeding layer, 429*b*: power feeding layer, 460*a*: layer.

The invention claimed is:

1. A semiconductor device comprising:
 a first layer comprising a transistor;
 a first connection terminal connected with said transistor and provided on said first layer comprising said transistor;
 a second layer comprising a passive element selected from the group consisting of inductor, capacitor and resistor;
 a second connection terminal provided on a first surface of said second layer comprising said passive element;
 a third connection terminal provided on a second surface of said second layer provided opposite to said first surface;
 an organic resin layer comprising a conductive particle dispersed in an adhesive resin and connecting said first connection terminal with said second connection terminal by the conductive particle;
 an antenna comprising a power feeding layer, a first conductive layer and a second conductive layer functioning as a ground body, said antenna further comprising a dielectric layer provided between said first conductive layer and said second conductive layer; and
 a connection layer electrically connecting said third connection terminal with said antenna,
 wherein the first conductive layer is formed on a first surface of the dielectric layer,
 wherein the second conductive layer is formed on a second surface of the dielectric layer, and
 wherein the power feeding layer is formed on a side, the first and the second surface of the dielectric layer.

2. A device according to claim 1 wherein said first layer comprising said transistor has a thickness of 1 µm to 10 µm.

3. A device according to claim 1 wherein said first layer comprising said transistor has a thickness of 1 µm to 5 µm.

4. A device according to claim 1 wherein said first layer comprising said transistor is provided over a flexible insulating substrate.

5. A device according to claim 4 wherein said transistor comprises an organic semiconductor layer.

6. A device according to claim 1 wherein said first layer comprising said transistor is attached to a flexible insulating substrate through an organic resin.

7. A device according to claim 1 wherein said first layer comprising said transistor comprises lamination of plural layers each comprising a corresponding transistor.

8. A device according to claim 1 wherein said connection layer comprises another organic resin layer comprising another conductive particle.

9. A device according to claim 1 wherein said connection layer comprises a third conductive layer.

10. A device according to claim 1 wherein said semiconductor device comprises a high frequency circuit.

11. A device according to claim 1 wherein said semiconductor device comprises a microprocessor.

12. A device according to claim 1 wherein said semiconductor device comprises a sensor.

13. A device according to claim 1 wherein said dielectric layer comprises a material selected from the group consisting of alumina, glass, forsterite, barium titanate, lead titanate, strontium titanate, lead zirconate, lithium niobate, and lead zirconium titanate.

14. A device according to claim 1 wherein said dielectric layer comprises a material selected from the group consisting of an epoxy resin, a phenol resin, a polybutadiene resin, bismaleimide triazine resin, vinylbenzyl, and polyfumarate.

15. A device according to claim 1 wherein said layer comprising said transistor constitutes at least one of a power source circuit, a clock generation circuit and a data demodulation and modulation circuit.

16. An electronic device comprising said semiconductor device according to claim 1.

17. A device according to claim 16 wherein said electronic device is selected from the group consisting of a liquid crystal display device, an EL display device, a television device, a cellular phone, a printer, a camera, a personal computer, a goggle with earphones, a speaker device, a headphone, a navigation device, and an electronic key.

18. A device according to claim 1 wherein the transistor is a thin film transistor.

19. A semiconductor device comprising:
 a first layer comprising a first transistor;

a first connection terminal connected with said first transistor and provided on said first layer comprising said first transistor;
a second layer comprising a second transistor;
a second connection terminal provided on a first surface of said second layer comprising said second transistor;
a third connection terminal provided on a second surface of said second layer opposite to said first surface;
a first organic resin layer comprising a first conductive particle dispersed in a first adhesive resin and connecting said first connection terminal with said second connection terminal by the first conductive particle;
an antenna comprising a power feeding layer, a first conductive layer and a second conductive layer functioning as a ground body, said antenna further comprising a dielectric layer provided between said first conductive layer and said second conductive layer; and
a second organic resin layer comprising a second conductive particle dispersed in a second adhesive resin and connecting said third connection terminal with said antenna by the second conductive particle,
wherein the first conductive layer is formed on a first surface of the dielectric layer,
wherein the second conductive layer is formed on a second surface of the dielectric layer, and
wherein the power feeding layer is formed on a side, the first and the second surface of the dielectric layer.

20. A device according to claim 19 wherein said first layer comprising said first transistor or said second layer comprising said second transistor has a thickness of 1 μm to 10 μm.

21. A device according to claim 19 wherein said first layer comprising said first transistor or said second layer comprising said second transistor has a thickness of 1 μm to 5 μm.

22. A device according to claim 19 wherein said first layer comprising said first transistor is provided over a flexible insulating substrate.

23. A device according to claim 22 wherein said first transistor comprises an organic semiconductor layer.

24. A device according to claim 19 wherein said first layer comprising said first transistor is attached to a flexible insulating substrate through an organic resin.

25. A device according to claim 19 wherein said semiconductor device comprises a high frequency circuit.

26. A device according to claim 19 wherein said semiconductor device comprises a microprocessor.

27. A device according to claim 19 wherein said semiconductor device comprises a sensor.

28. A device according to claim 19 wherein said dielectric layer comprises a material selected from the group consisting of alumina, glass, forsterite, barium titanate, lead titanate, strontium titanate, lead zirconate, lithium niobate, and lead zirconium titanate.

29. A device according to claim 19 wherein said dielectric layer comprises a material selected from the group consisting of an epoxy resin, a phenol resin, a polybutadiene resin, a bismaleimide triazine resin, vinylbenzyl, and polyfumarate.

30. A device according to claim 19 wherein at least one of said first layer comprising said first transistor and said second layer comprising said second transistor constitutes at least one of a power source circuit, a clock generation circuit and a data demodulation and modulation circuit.

31. An electronic device comprising said semiconductor device according to claim 19.

32. An electronic device according to claim 31 wherein said electronic device is selected from the group consisting of a liquid crystal display device, an EL display device, a television device, a cellular phone, a printer, a camera, a personal computer, a goggle with earphones, a speaker device, a headphone, a navigation device, and an electronic key.

33. A device according to claim 19 wherein the transistor is a thin film transistor.

34. A semiconductor device comprising:
a first layer comprising a first transistor;
a first connection terminal connected with said first transistor and provided on said first layer comprising said first transistor;
a second layer comprising a second transistor;
a second connection terminal provided on a first surface of said second layer comprising said second transistor;
a third connection terminal provided on a second surface of said second layer opposite to said first surface;
a first organic resin layer comprising a first conductive particle dispersed in a first adhesive resin and connecting said first connection terminal with said second connection terminal by the first conductive particle;
a layer comprising a passive element selected from the group consisting of inductor, capacitor and resistor;
a fourth connection terminal provided on a first surface of said layer comprising said passive element;
a fifth connection terminal provided on a second surface of said layer comprising said passive element opposite to said first surface of said layer comprising said passive element;
a second organic resin layer comprising a second conductive particle dispersed in a second adhesive resin and connecting said third connection terminal with said fourth connection terminal by the second conductive particle;
an antenna comprising a power feeding layer, a first conductive layer and a second conductive layer functioning as a ground body, said antenna further comprising a dielectric layer provided between said first conductive layer and said second conductive layer; and
a connection layer electrically connecting said fifth connection terminal with said antenna,
wherein the first conductive layer is formed on a first surface of the dielectric layer,
wherein the second conductive layer is formed on a second surface of the dielectric layer, and
wherein the power feeding layer is formed on a side, the first and the second surface of the dielectric layer.

35. A device according to claim 34 wherein said first layer comprising said first transistor or said second layer comprising said second transistor has a thickness of 1 μm to 10 μm.

36. A device according to claim 34 wherein said first layer comprising said first transistor or said second layer comprising said second transistor has a thickness of 1 μm to 5 μm.

37. A device according to claim 34 wherein said first layer comprising said first transistor is provided over a flexible insulating substrate.

38. A device according to claim 37 wherein said first transistor comprises an organic semiconductor layer.

39. A device according to claim 34 wherein said first layer comprising said first transistor is attached to a flexible insulating substrate through an organic resin.

40. A device according to claim 34 wherein said connection layer comprises a third organic resin layer comprising a third conductive particle.

41. A device according to claim 34 wherein said connection layer comprises a third conductive layer.

42. A device according to claim 34 wherein said semiconductor device comprises a high frequency circuit.

43. A device according to claim 34 wherein said semiconductor device comprises a microprocessor.

44. A device according to claim 34 wherein said semiconductor device comprises a sensor.

45. A device according to claim 34 wherein said dielectric layer comprises a material selected from the group consisting of alumina, glass, forsterite, barium titanate, lead titanate, strontium titanate, lead zirconate, lithium niobate, and lead zirconium titanate.

46. A device according to claim 34 wherein said dielectric layer comprises a material selected from the group consisting of an epoxy resin, a phenol resin, a polybutadiene resin, bismaleimide triazine resin, vinylbenzyl, and polyfumarate.

47. A device according to claim 34 wherein at least one of said first layer comprising said first transistor and said second layer comprising said second transistor constitutes at least one of a power source circuit, a clock generation circuit and a data demodulation and modulation circuit.

48. An electronic device comprising said semiconductor device according to claim 34.

49. A device according to claim 48 wherein said electronic device is selected from the group consisting of a liquid crystal display device, an EL display device, a television device, a cellular phone, a printer, a camera, a personal computer, a goggle with earphones, a speaker device, a headphone, a navigation device and an electronic key.

50. A device according to claim 34 wherein the transistor is a thin film transistor.

51. A semiconductor device comprising:
a layer comprising a first transistor and a second transistor and a first antenna connected with said first transistor;
a connection terminal connected with said second transistor and provided on said layer comprising said first transistor and said second transistor and said first antenna;
a second antenna comprising a power feeding layer, a first conductive layer and a second conductive layer functioning as a ground body, said second antenna further comprising a dielectric layer provided between said first conductive layer and said second conductive layer; and
an organic resin layer comprising a conductive particle dispersed in an adhesive resin and connecting said connection terminal with said second antenna by the conductive particle,
wherein the first conductive layer is formed on a first surface of the dielectric layer,
wherein the second conductive layer is formed on a second surface of the dielectric layer, and
wherein the power feeding layer is formed on a side, the first and the second surface of the dielectric layer.

52. A device according to claim 51 wherein said layer comprising said first transistor and said second transistor and said first antenna is provided over a flexible insulating substrate.

53. A device according to claim 52 wherein each of said first transistor and said second transistor comprises an organic semiconductor layer.

54. A device according to claim 51 wherein said layer comprising said first transistor and said second transistor and said first antenna is attached to a flexible insulating substrate through an organic resin.

55. A device according to claim 51 wherein said semiconductor device comprises a high frequency circuit.

56. A device according to claim 51 wherein said semiconductor device comprises a microprocessor.

57. A device according to claim 51 wherein said semiconductor device comprises a sensor.

58. A device according to claim 51 wherein said dielectric layer comprises a material selected from the group consisting of alumina, glass, forsterite, barium titanate, lead titanate, strontium titanate, lead zirconate, lithium-niobate, and lead zirconium titanate.

59. A device according to claim 51 wherein said dielectric layer comprises a material selected from the group consisting of an epoxy resin, a phenol resin, a polybutadiene resin, a bismaleimide triazine resin, vinylbenzyl, and polyfumarate.

60. A device according to claim 51 wherein said layer comprising said first transistor and said second transistor and said first antenna constitutes at least one of a power source circuit, a clock generation circuit and a data demodulation and modulation circuit.

61. An electronic device comprising said semiconductor device according to claim 51.

62. A device according to claim 61 wherein said electronic device is selected from the group consisting of a liquid crystal display device, an EL display device, a television device, a cellular phone, a printer, a camera, a personal computer, a goggle with earphones, a speaker device, a headphone, a navigation device, and an electronic key.

63. A device according to claim 51 wherein the transistor is a thin film transistor.

64. A semiconductor device comprising:
a layer comprising a first transistor and a second transistor;
a first connection terminal connected with said first transistor and provided on a first surface of said layer comprising said first transistor and said second transistor;
a second connection terminal connected with said second transistor and provided on a second surface of said layer comprising said first transistor and said second transistor opposite to said first surface;
a first antenna comprising a first power feeding layer, a first conductive layer and a second conductive layer functioning as a first ground body, said first antenna further comprising a first dielectric layer provided between said first conductive layer and said second conductive layer;
a second antenna comprising a second power feeding layer, a third conductive layer and a fourth conductive layer functioning as a second ground body, said second antenna further comprising a second dielectric layer provided between said third conductive layer and said fourth conductive layer;
a first organic resin layer comprising a first conductive particle dispersed in a first adhesive resin and connecting said first antenna with said first connection terminal by the first conductive particle; and
a second organic resin layer comprising a second conductive particle dispersed in a second adhesive resin and connecting said second antenna with said second connection terminal by the second conductive particle,
wherein the first conductive layer is formed on a first surface of the first dielectric layer,
wherein the second conductive layer is formed on a second surface of the first dielectric layer,
wherein the first power feeding layer is formed on a side, the first and the second surface of the first dielectric layer,
wherein the third conductive layer is formed on a first surface of the second dielectric layer,
wherein the fourth conductive layer is formed on a second surface of the second dielectric layer,
wherein the second power feeding layer is formed on a side, the first and the second surface of the second dielectric layer.

65. A device according to claim 64 wherein said layer comprising said first transistor and said second transistor has a thickness of 1 μm to 10 μm.

66. A device according to claim 64 wherein said layer comprising said first transistor and said second transistor has a thickness of 1 μm to 5 μm.

67. A device according to claim 64 wherein said semiconductor device comprises a high frequency circuit.

68. A device according to claim 64 wherein said semiconductor device comprises a microprocessor.

69. A device according to claim 64 wherein said semiconductor device comprises a sensor.

70. A device according to claim 64 wherein each of said first dielectric layer and said second dielectric layer comprises a material selected from the group consisting of alumina, glass, forsterite, barium titanate, lead titanate, strontium titanate, lead zirconate, lithium niobate, and lead zirconium titanate.

71. A device according to claim 64 wherein each of said first dielectric layer and said second dielectric layer comprises a material selected from the group consisting of an epoxy resin, a phenol resin, a polybutadiene resin, a bismaleimide triazine resin, vinylbenzyl, and polyfumarate.

72. A device according to claim 64 wherein said layer comprising said first transistor and said second transistor constitutes at least one of a power source circuit, a clock generation circuit and a data demodulation and modulation circuit.

73. An electronic device comprising said semiconductor device according to claim 64.

74. A device according to claim 64 wherein the transistor is a thin film transistor.

75. A device according to claim 73 wherein said electronic device is selected from the group consisting of a liquid crystal display device, an EL display device, a television device, a cellular phone, a printer, a camera, a personal computer, a goggle with earphones, a speaker device, a headphone, a navigation device, and an electronic key.

76. A semiconductor device comprising:
a layer comprising a transistor;
a connection terminal connected with said transistor and provided on said layer comprising said transistor;
an antenna comprising a power feeding layer, a first conductive layer and a second conductive layer functioning as a ground body, said antenna further comprising a dielectric layer provided between said first conductive layer and said second conductive layer; and
an organic resin layer comprising a conductive particle dispersed in an adhesive resin and connecting said antenna with said connection terminal by the conductive particle,
wherein the first conductive layer is formed on a first surface of the dielectric layer,
wherein the second conductive layer is formed on a second surface of the dielectric layer, and
wherein the power feeding layer is formed on a side, the first and the second surface of the dielectric layer.

77. A device according to claim 76 wherein said layer comprising said transistor has a thickness of 1 μm to 10 μm.

78. A device according to claim 76 wherein said layer comprising said transistor has a thickness of 1 μm to 5 μm.

79. A device according to claim 76 wherein said layer comprising said transistor is provided over a flexible insulating substrate.

80. A device according to claim 79 wherein said transistor comprises an organic semiconductor layer.

81. A device according to claim 76 wherein said layer comprising said transistor is attached to a flexible insulating substrate through an organic resin.

82. A device according to claim 76 wherein said layer comprising said transistor comprises lamination of plural layers each comprising a corresponding transistor.

83. A device according to claim 76 wherein said semiconductor device comprises a high frequency circuit.

84. A device according to claim 76 wherein said semiconductor device comprises a microprocessor.

85. A device according to claim 76 wherein said semiconductor device comprises a sensor.

86. A device according to claim 76 wherein said dielectric layer comprises a material selected from the group consisting of alumina, glass, forsterite, barium titanate, lead titanate, strontium titanate, lead zirconate, lithium niobate, and lead zirconium titanate.

87. A device according to claim 76 wherein said dielectric layer comprises a material selected from the group consisting of an epoxy resin, a phenol resin, a polybutadiene resin, a bismaleimide triazine resin, vinylbenzyl, and polyfumarate.

88. A device according to claim 76 wherein said layer comprising said transistor constitutes at least one of a power source circuit, a clock generation circuit and a data demodulation and modulation circuit.

89. An electronic device comprising said semiconductor device according to claim 76.

90. A device according to claim 89 wherein said electronic device is selected from the group consisting of a liquid crystal display device, an EL display device, a television device, a cellular phone, a printer, a camera, a personal computer, a goggle with earphones, a speaker device, a headphone, a navigation device, and an electronic key.

91. A device according to claim 76 wherein the transistor is a thin film transistor.

* * * * *

UNITED STATES PATENT AND TRADEMARK OFFICE
CERTIFICATE OF CORRECTION

PATENT NO.         : 8,783,577 B2
APPLICATION NO.    : 11/885634
DATED              : July 22, 2014
INVENTOR(S)        : Yukie Suzuki et al.

It is certified that error appears in the above-identified patent and that said Letters Patent is hereby corrected as shown below:

IN THE SPECIFICATION:

At column 9, line 52, "ClF$_3$;" should be --ClF$_3$;--;

At column 9, line 57, "ClF," should be --ClF,--;

At column 23, line 48, "(Er)," should be --(Ir),--;

At column 25, line 12, "(ClF$_3$)." should be --(ClF$_3$).--;

IN THE CLAIMS:

In claim 51, at column 37, line 33, "laver," should be --layer,--.

Signed and Sealed this
Sixth Day of January, 2015

Michelle K. Lee
*Deputy Director of the United States Patent and Trademark Office*